United States Patent [19]

Edwards

[11] Patent Number: 5,235,600
[45] Date of Patent: Aug. 10, 1993

[54] SCANNABLE SYSTEM WITH ADDRESSABLE CLOCK SUPPRESS ELEMENTS

[75] Inventor: Robert Edwards, San Jose, Calif.

[73] Assignee: Amdahl Corporation, Sunnyvale, Calif.

[21] Appl. No.: 672,951

[22] Filed: Mar. 21, 1991

[51] Int. Cl.⁵ .................................... G01R 31/28
[52] U.S. Cl. ........................................... 371/22.3
[58] Field of Search ............... 371/22.3, 22.1, 15.1; 324/158 R

[56] References Cited

U.S. PATENT DOCUMENTS 4,554,664  11/1985  Schultz ........................ 371/22.3
5,101,153   3/1992  Morong, III ............... 324/158 R

*Primary Examiner*—Charles E. Atkinson
*Attorney, Agent, or Firm*—Fliesler, Dubb, Meyer & Lovejoy

[57] ABSTRACT

A mesh comprised of intersecting control lines and clock-passing elements is distributed across the substrate of an integrated circuit (IC) chip to control the distribution of clock pulses to clock-sensitive scan latches also provided on the IC chip. The mesh consumes a relatively small portion of the surface area over the substrate. Clock-insensitive scan latches drive the control lines to create a pattern of enabled and disabled clock-passing elements such that the dynamic performance of one or more subcircuits on the IC chip can be tested through an on-chip scan testing subsystem.

21 Claims, 6 Drawing Sheets

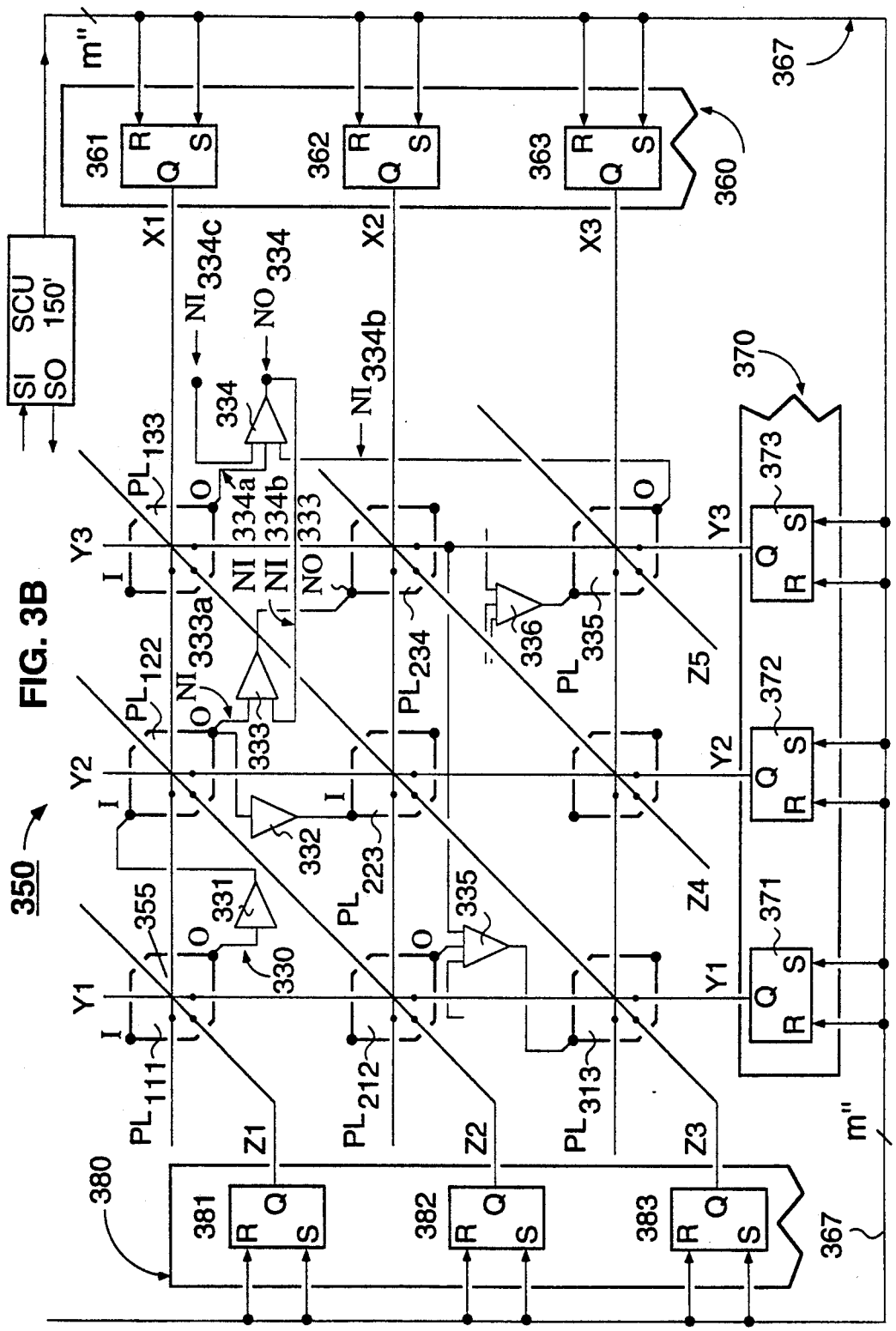

SCANNABLE SYSTEM WITH ADDRESSABLE CLOCK SUPPRESS ELEMENTS

BACKGROUND OF THE INVENTION

1. Field of the Invention

The invention relates to scan testing of digital circuitry. More particularly it relates to scan testing in high-speed, densely-packed computer circuits where testing the dynamic functionality of each subcircuit is as important as testing its static functionality but where space limitations leave little room for scan test circuitry.

2. Cross Reference to Related Copending Applications

The present application is related to copending U.S. patent application Ser. No. 07/670,289 entitled "SCANNABLE SYSTEM WITH ADDRESSABLE SCAN RESET GROUPS", by Robert Edwards et al, which was filed Mar. 15, 1991. Said copending application is assigned to the assignee of the present application and its disclosure is incorporated herein by reference.

Cross Reference to Related Patents

The following U.S. Patents are assigned to the assignee of the present application and are further incorporated herein by reference: (A) U.S. Pat. No. 4,244,019, DATA PROCESSING SYSTEM INCLUDING A PROGRAM-EXECUTING SECONDARY SYSTEM CONTROLLING A PROGRAM-EXECUTING PRIMARY SYSTEM, issued to Anderson et al, Jan. 6, 1981; (B) U.S. Pat. No. 4,752,907, INTEGRATED CIRCUIT SCANNING APPARATUS HAVING SCANNING DATA LINES FOR CONNECTING SELECTED DATA LOCATIONS TO AN I/O TERMINAL, issued to Si, et al. Jun. 21, 1988; (C) U.S. Pat. No. 4,819,166, MULTI-MODE SCAN APPARATUS, issued to Si et al Apr. 4, 1989; and (D) U.S. Pat. No. 4,661,953, ERROR TRACKING APPARATUS IN A DATA PROCESSING SYSTEM, issued to Venkatesh et al, Apr. 28, 1987.

Background

Scan testing systems are one type of mechanism by which otherwise difficult-to-access components within a large complex of electronic circuits can be accessed and their states can be detected and/or altered to thereby detect and/or correct functional errors. Examples of scan test structures and their uses may be found in the above cited U.S. Patents.

A scan testing system is typically formed by defining a set of uniquely addressable scan points (e.g., $SP_{001}$, $SP_{002}$, $SP_{003}$, etc.) located at preselected parts inside of a circuit to be tested. Scan point reading means are provided for uniquely addressing each scan point (hereafter, $SP_{ZYK}$, where "x" "y" and "z" are arbitrary identifiers). The reading means detects the state of an addressed scan point, $SP_{ZYK}$, and relays the detected state to an external point for analysis.

If a scan point ($SP_{ZYK}$) is driven either directly or indirectly by a bistable latch, then scan point driving means are also provided for addressing that latch, forcing it into a predetermined state (usually the logic high or "set" state ("1")) and thereby driving its corresponding scan point ($SP_{ZYX}$) into a responsive state. A latch which drives a scan point ($SP_{ZYX}$) either directly or indirectly is referred to here as a scan latch and denoted by $SL_{ZYK}$.

When conventional scan testing begins, every scan latch ($SL_{ZYX}$) in the system under test (SUT) is disabled from responding to signals presented at a normal data input terminal (D) of that latch. This is usually done by disabling a clock distribution line which supplies system clock pulses to all the scan latches ($SL_{ZYX}$) The data output terminal (Q) of each scan latch ($SL_{ZYX}$) can be forced to a logic one state ("1"), even though the latch is not being clocked, by applying a logic "1" to a set terminal (SET) of the latch. The data output terminal (Q) can be forced to a logic zero state ("0") by applying a logic "1" to an opposing reset terminal (RST) of the scan latch ($SL_{ZYX}$). The forced state propagates from the output terminal (Q) to a subcircuit of interest within the circuitry under test (SUT) and the response of the subcircuit to such stimulus is detected at an appropriate scan point. The detected response is then relayed out by the scan test system for external analysis.

Response detection usually occurs a long time after a stimulus signal is applied so that enough time is provided for signals to propagate through the circuit under test and for the outputs to settle into steady state levels (logic "1" or logic "0"). This type of detection is referred to as "static function testing" (SFT) because only the static, long term behavior of the stimulated circuit is being observed.

When high-speed circuits are being evaluated, it is desirable to also test their ability to respond within a prespecified time limit to input transitions. For example, a combinatorial logic network might function as intended at slow clock rates (e.g., 1 KHz) but excessive delays may produce undesired results at higher clock rates (e.g., 100 MHz). It might be that a subcircuit of the network fails to respond as expected within the shorter clock period (e.g., 10 nanoseconds) and the network therefore produces an erroneous result. A test which detects such a high speed fault is referred to here as a "dynamic function test" (DFT).

One test apparatus for performing a dynamic function test (DFT) comprises the circuit to-be-tested (also referred to here as Circuit-Under-Test or "CktUT" for short), a first scan latch ($SL_{001}$) having its data output terminal ($Q_1$) connected to an input of the CktUT and a second scan latch ($SL_{002}$) having its data input terminal ($D_2$) connected to an output of the CktUT.

At a first time point, $t_0$, the first and second scan latches ($SL_{001}$ and $SL_{002}$) are initialized (assume both are cleared to the logic "0" state). A static first logic level (assume a "1") which has a value opposite to the current value ("0") held in the first scan latch ($SL_{001}$) is applied to a data input terminal ($D_1$) of the first scan latch ($SL_{001}$). At a second time point, $t_1$, a first clock pulse is applied only to a clock input terminal of the first scan latch ($SL_{001}$) thereby loading the static first logic level ("1") into the first scan latch ($SL_{001}$) and thus toggling the level applied to the input of the CktUT from "0" to "1". At a third time point, $t_2$, a second clock pulse is applied only to a clock input terminal of the second scan latch ($SL_{002}$) thereby loading the second scan latch ($SL_{002}$) with whatever logic level is then present at the output of the CktUT. The state of the second scan latch ($SL_{002}$) is then scanned out to detect the level of the CktUT output at the third time point, $t_2$, and to thus determine whether the dynamic behavior of the CktUT was satisfactory in the test period, $t_2$-$t_1$.

The length of the latter time period, $t_2$-$t_1$, is varied over a range including a required response, time $t_{req}$, of the circuit under test (CktUT) and the $t_2$ output of the CktUT is checked over the range to determine whether the CktUT responds as expected even when the test period, $t_2-t_1$, is shortened to or below the required response time, $t_{req}$.

To test the dynamic response of a CktUT to an input signal that switches from "1" to "0", the first scan latch ($SL_{001}$) is set to logic "1" at time $t_0$ and a logic "0" is loaded into it at time $t_1$. The procedure is the same thereafter.

Results obtained from the above dynamic function test (DFT) are valid only if no state changes occur in all other circuits which affect the combination of the first and second scan latches ($SL_{001}$ and $SL_{002}$) plus the CktUT. The circuit under test has to be "isolated" from all other circuits which it normally cooperates with. In view of this, it is desirable to control the application of clock signals to all circuits, not just to the CktUT, so that at time point $t_1$, a clock pulse is applied only to the first scan latch ($SL_{001}$) and to no other response-affecting component and such that at time point $t_2$, a clock pulse is applied only to the second scan latch ($SL_{002}$) and to no other response-affecting component. This assures that the results of the DFT are dependent only on transitions propagating from the stimulated input of the CktUT to the output of the CktUT. Some means should be provided for suppressing the application of clock signals to extraneous circuits.

A problem arises when the above dynamic test is to be carried out in high density circuits such as those found on Very-Large Scale Integrated circuit (VLSI) chips. Often, there will be many scan latches in a high density circuit (typically 512 or more on each VLSI chip) but substrate area will be at a premium. If a separate clock apply/don't-apply circuit is included for every scan latch, an unacceptable amount of substrate area might be consumed.

The area allotted for scan support circuitry is usually quite small (e.g., less than one third the total circuit-support area). Scan functions are used primarily for test purposes and only rarely to implement normal (nontest) circuit functions. Accordingly, from the view point of normal circuit functionality, the scan-implementing circuitry is considered undesirable overhead and the conventional philosophy is to implement the scan testing functions with as little circuitry as possible.

In keeping with this philosophy, when scan test circuitry was included in previous high-density IC chips (or on densely-packed circuit boards), the on-chip (or on-board) scan circuits did not include any means for carrying out dynamic functionality tests. Dynamic function tests were either not performed at all or performed on only a few subcircuits whose input and output terminals happened to be externally accessible.

In some systems, however, it is desirable to test the dynamic performances of all subcircuits, not just those whose input and output terminals happen to be externally accessible. High-speed computers such as an IBM or Amdahl mainframe are examples of densely-packed systems where the dynamic performance of every subcircuit can be critical to the overall performance of the system.

It would be advantageous to be able to test the dynamic performance of every subcircuit in such high-density systems without increasing the number of pins on each IC chip or increasing the number of contacts on each printed circuit board. It would be more advantageous to have an automatic built-in mechanism which may be used conveniently and periodically to test the dynamic performance of each subcircuit during system bring-up and even afterwards over the operating life of the system without requiring the removal of chips and/or boards or other mechanical interference with the chips and/or circuit boards of the system under test. It would be even more advantageous if the built-in mechanism could test the dynamic performance of every subcircuit in such systems without halting ongoing operations of other subcircuits within the system which are not being tested and if the built-in mechanism could also maintain a history of changes in dynamic performance. Long term degradations in performance could then be conveniently detected and corrected before they advance to a point where shut-down of the entire system is required. The above advantages are all desirable, but testing has to be performed in high-density circuits without consuming too much of the limited substrate area available on each IC chip and/or on each printed circuit board.

SUMMARY OF THE INVENTION

An objective of the invention is to provide a scan test subsystem within the circuitry of a system under test (SUT) where the scan test subsystem includes a means of relatively small surface area for testing the dynamic performance of subcircuits within the SUT.

In accordance with one aspect of the invention, a clock-control mesh formed of intersecting control lines is defined in a synchronous, scan-testable machine. The intersecting control lines define a plurality of individually addressable control points which are distributed among the subcircuits of the scan-testable machine. A mesh addressing means for addressing the control points of the mesh is provided along a periphery of the mesh to drive its control lines.

The mesh preferably has a square-like or circle-like configuration such that the surface area enclosed by the mesh and the number of control points defined within the mesh are effectively maximized while the perimeter of the mesh is essentially minimized. Correspondingly, the number of control points within the mesh is maximized while the number of control lines and the size of the peripheral mesh-addressing means is essentially minimized.

The scan-testable machine includes a plurality of clock-sensitive scan latches interposed between its subcircuits and a clock supply line for supplying system clock pulses to these scan latches. Each clock-sensitive scan latch is associated with one of the addressable control points of the clock-control mesh.

During a nontest, normal operating mode of the machine, system clock pulses are supplied to all clock-sensitive scan latches so that signals pass synchronously from one subcircuit of the scan-testable machine to a next subcircuit through an interposed scan latch. During static and dynamic test modes, system clock pulses are withheld from some or all of the clock-sensitive scan latches so that signals are blocked from passing from one subcircuit of the scan-testable machine to a next subcircuit at locations where the system clock pulses are withheld from the interposed scan latch.

A clock-passing element of relatively small size is associated with each of the control points and provided for selectively withholding or passing system clock pulses to an adjacent, one or more of the clock-sensitive scan latches. Each clock-passing element responds to control signals produced by the mesh addressing means and transmitted over the control lines of the mesh such that the clock-passing element selectively enables or disables its corresponding one or more of the clock-sensitive scan latches to respond to system clock pulses.

An enabled clock-sensitive scan latch is said to be sensitized. A disabled clock-sensitive scan latch is said to be desensitized. Patterns of desensitized and sensitized scan latches are formed as described in more detail below to test the static and dynamic behavior of each subcircuit in the scan-testable machine.

In accordance with another aspect of the invention, relatively little substrate area is consumed by the circuitry used for creating the pattern of sensitized and desensitized scan latches.

A circuit support substrate of finite surface area supports the subcircuits of the synchronous machine, the scan latches, the control lines of the clock-control mesh, the clock passing elements and the mesh addressing means. The control lines of the clock-control mesh are of relatively small width and the clock-passing elements are of relatively small size so that the combination of the mesh and clock-passing elements consumes a relatively small portion of the surface area over the substrate.

Clock-insensitive scan latches (OSL's) of relatively small size are preferably provided in the mesh addressing means to drive the control lines of the mesh. The states of these clock-insensitive scan latches are controlled by a scan control unit to create desired patterns of sensitized and desensitized scan latches. Some of these patterns are used for testing the dynamic performance of one or more subcircuits of the scan-testable machine.

When the clock-control mesh is preferentially arranged in a square-like or circle-like configuration, as mentioned above, the ratio between the number of control points in the mesh and the number of control lines in the mesh is substantially maximized. The number of clock-insensitive latches needed for driving a given number of control points and the space consumed by these clock-insensitive latches is thereby advantageously minimized.

In one embodiment, the clock-control mesh includes X and Y directed lines which extend at right angles across a high-density integrated circuit (IC) chip to define an X-by-Y gridwork of addressable control points. Each clock-sensitive scan latch on the IC chip is assigned at least an "X" identification number and a "Y" identification number for dynamic testing purposes. The X and Y identification numbers each correspond to individual X and Y directed lines of the clock-distribution control mesh. Each X or Y directed line is driven by a line-driving element.

The difference between the number of X-directed lines and the number of Y-directed lines is preferably less than three so that the total number of line-driving elements is relatively small and the corresponding substrate area consumed by all the line-driving elements of the mesh is relatively small in relation to the number of control points. Dynamic function testing is thereby made feasible in high density circuits.

In accordance with an optional, further aspect of the invention, the clock-control mesh further includes a plurality of Z directed lines which extend through the addressable points of the X-by-Y gridwork so that addressable control points lying on an X-directed line can be distinguished from one another either according to their Y identification numbers or according to their Z identification numbers. Each clock-sensitive scan latch is assigned a "Z" identification number in addition to its X and Y identification numbers. The Z identification numbers each correspond to individual ones of the Z directed lines.

Each clock-passing element receives as its control lines at least one X directed line, one Y directed line, and, optionally, a Z directed line. The clock passing element either passes clock pulses to a clock receiving terminal of its corresponding scan latch or suppresses the transmission of such clock pulses to the clock receiving terminal of its corresponding scan latch according to control signals provided on the X, the Y and optionally on the Z directed lines.

In one operating mode of the invention, a preselected one or a pair of the X directed lines is activated by one or two corresponding latches in a first array of addressable, clock-insensitive operating-state-latches (OSL's) provided along one side of the X-by-Y gridwork. A preselected one or pair of the Y directed lines is activated by one or two corresponding latches in a second array of addressable operating-state-latches (OSL's) provided along a second side of the X-by-Y gridwork. All other X and Y-directed lines are deactivated.

This selective activation of the X and Y directed lines is used to create a pattern where a unique set of either two or four clock-passing elements are enabled while all other clock-passing elements of the high density circuit are disabled. A dynamic function test is then conveniently carried out as follows.

If only one X directed (X1) line and two Y directed lines (Y1, Y2) are activated, then a corresponding pair of clock-passing elements along the X directed line are enabled to pass clock signals to their associated scan latches. All other clock-passing elements are disabled.

At a first time point, $t_0$, either before the pair of clock passing elements are enabled or after they are enabled but before system clock pulses are supplied, the associated first and second scan latches ($SL_{X1,Y1}$ and $SL_{X1,Y2}$) are initialized to desired states. A static first logic level having a value (e.g., "1") opposite to the current value (e.g., "0") held in the first scan latch ($SL_{X1,Y1}$) is applied to a data input terminal of the first scan latch. As an option, a static second logic level having a value opposite to a next-expected value at a data input terminal of the second scan latch ($SL_{X1,Y2}$) is applied to the data input terminal of the second scan latch ($SL_{X1,Y2}$).

At a second time point, $t_1$, after the selective enablement of the clock passing elements, a first clock pulse is applied through the enabled clock-passing elements to clock-receiving terminals of the associated first and second scan latches ($SL_{X1,Y1}$ and $SL_{X1,Y2}$), thereby loading the static first logic level (e.g.,"1") into the first scan latch ($SL_{X1,Y1}$) and toggling the state of its output terminal (Q) (e.g., from "0" to "1"). The state loaded into the second scan latch ($SL_{X1,Y2}$) at the second time point, $t_1$, is preferably opposite to that expected at a next-to-be described third time point, $t_2$, but does not have to be so.

At the third time point, $t_2$, which follows second time point $t_1$, a second clock pulse is applied through the enabled clock-passing elements to the clock receiving terminals of the associated first and second scan latches ($SL_{X1,Y1}$ and $SL_{X1,Y2}$) thereby loading a second logic level present at an input terminal of the second scan latch ($SL_{X1,Y2}$) into that second scan latch ($SL_{X1,Y2}$). The state of the second scan latch ($SL_{X1,Y2}$) is then scanned out.

The first and second scan latches ($SL_{X1,Y1}$ and $SL_{X1,Y2}$) are selected so that the output terminal of the first scan latch ($SL_{X1,Y1}$) is connected to the input of a to-be-tested subcircuit and the input terminal of the second scan latch ($SL_{X1,Y2}$) is connected to the output of the same to-be-tested subcircuit. A dynamic function test (DFT) is thus carried out.

If, instead of one X and two Y lines, only one Y directed line (Y1) and two X directed lines (X1, X2) are activated, then a corresponding pair of clock-passing elements along the Y directed line are enabled to pass clock signals to their associated scan latches ($SL_{X1,Y1}$ and $SL_{X2,Y1}$) and the above-described DFT is carried out on a to-be-tested subcircuit between those scan latches ($SL_{X1,Y1}$ and $SL_{X2,Y1}$).

If, on the other hand, two Y directed lines (Y1, Y2) and two X directed lines (X1, X2) have to be simultaneously activated to perform a DFT on a preselected subcircuit, then a corresponding four of the clock-passing elements are enabled to pass clock signals to their associated four scan latches ($SL_{X1,Y1}$, $SL_{X2,Y1}$, $SL_{X1,Y2}$, and $SL_{X2,Y2}$). In this last scenario, a number of different approaches are available for carrying out a dynamic function test (DFT) in accordance with the invention.

For simplicity, each combination of a clock-passing element and its corresponding scan latch is referred to below as a "pass-latch unit" (PLU).

Under one approach, the above mentioned Z lines are included within the scan testing circuitry and used to enable only two of the four clock-passing elements addressed by the X and Y lines thus leaving the other two elements disabled during the DFT. The DFT can therefore be performed as described above for the case when only two elements are enabled by the X and Y lines. A preselected one of the Z directed lines is activated by a corresponding latch in a third array of addressable operating-state-latches (OSL's) to enable the desired pair of clock-passing elements.

According to a second approach, the Z directed lines and their associated third array of OSL's are not included in the scan test circuitry. Substrate area is thereby conserved.

In place of the Z directed lines, a software routine is employed in an associated "service computer" to determine whether a DFT can be performed on a desired subcircuit whose input and output terminals are operatively coupled to a first two of the enabled four scan-latch/clock-passing units (PLU's) without being affected by the enablement of the other two PLU's. If this condition is true, then the DFT proceeds as before.

If the condition is false, then the software routine is used to further determine whether the system under test (SUT) can be reconfigured so that enablement of the second two of the enabled four PLU's will not affect the outcome of the DFT, and if so, such reconfiguration is automatically undertaken under software control, and the DFT proceeds as before.

Finally, if neither possibility is available, the dynamic function test (DFT) is either bypassed or performed nonetheless for the subject subcircuit and the software routine alerts system users of this test bypass condition.

While the above describes conditions wherein just two or four pass-latch units (PLU's) are simultaneously enabled it is within the contemplation of the present invention to simultaneously enable many sets of two or four PLU's, where conditions allow, so that dynamic testing of isolated subcircuits within a large system may proceed in parallel.

BRIEF DESCRIPTION OF THE DRAWINGS

The invention is described in more detail with reference to the following figures in which:

FIG. 3B is a schematic diagram of a matrix of pass-latch units (PLU's) and their associated X, Y and optional Z directed lines which are driven by X, Y and optional Z latch arrays in accordance with the invention.

DETAILED DESCRIPTION

Figure 1:
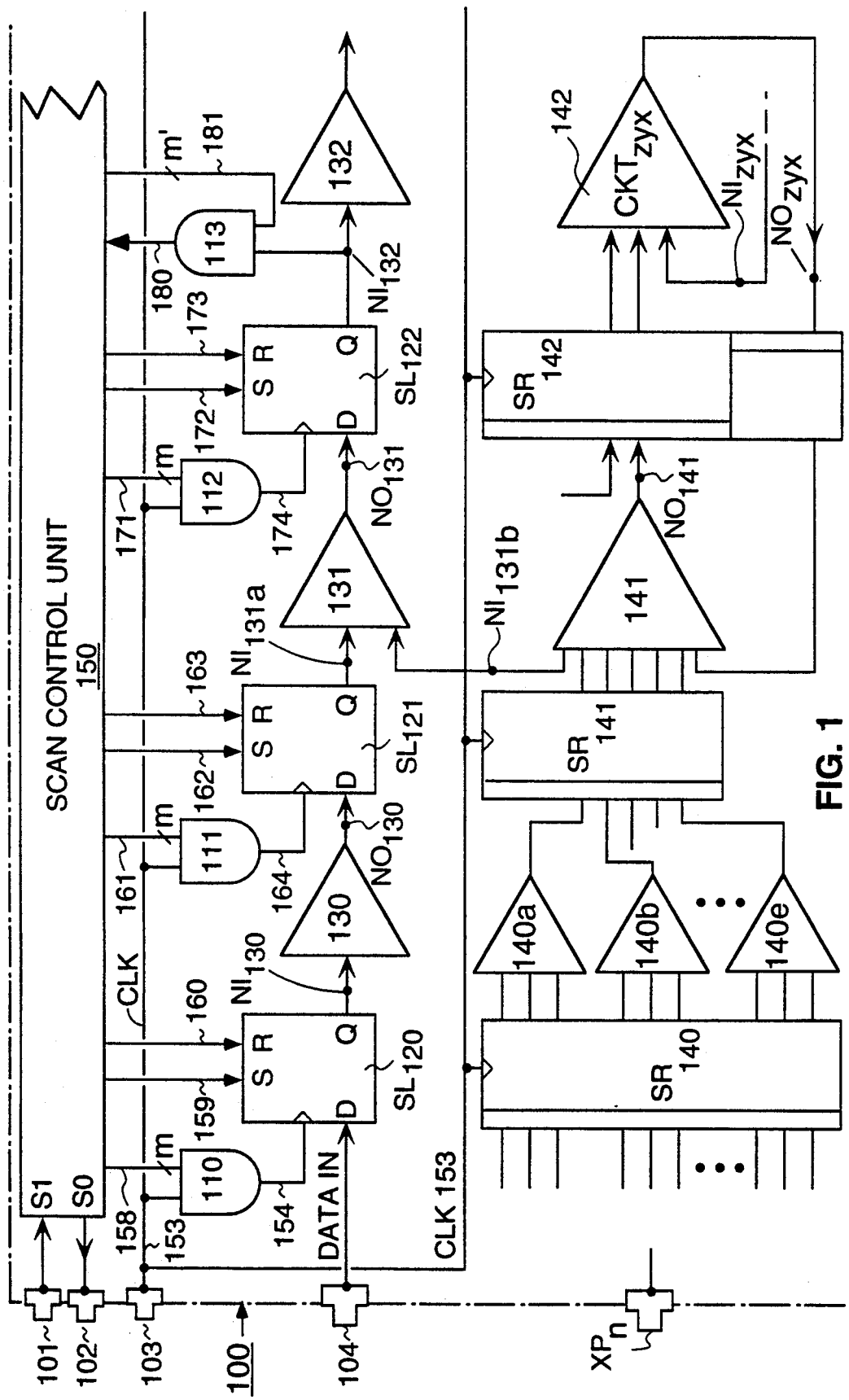
FIG. 1 is a schematic diagram of an integrated circuit (IC) chip which is structured for dynamic function testing in accordance with the invention.

FIG. 1 shows an integrated circuit (IC) chip 100 in accordance with the invention. The chip 100 which is to be tested for dynamic functionality either on its own (i.e., chip-level testing) or in conjunction with one or more similarly constructed IC chips (i.e., board-level testing) is referred to hereafter as being part or all of a System Under Test (SUT).

A plurality of external connection points, 101, 102, 103, etc., ..., XPn, are provided on the chip 100 to couple preselected internal parts of the chip to external circuits (not shown). Typically, the IC chip 100 is encapsulated so that it is difficult, if not impossible, to make direct electrical contact with many other of its internal parts. The symbol, XPi, is used to refer generically to the external connection points.

Some of the internal parts of the chip 100 are shown to be conceptually incorporated into an array of subcircuits, 130, 131, 132, 140a, 140b, 140c, etc., ... $CKT_{ZYX}$. The last reference symbol, $CKT_{ZYX}$, is used below to refer generically to all the subcircuits including 130, 131, etc. Subscripts "z", "y" and "x" represent arbitrary designators which are referred to here respectively as the plane-number, the row-number and the column-number. The "x" and "y" subscripts can represent the physical column and row location of a particular subcircuit $CKT_{ZYX}$ on the surface of the IC chip 100, although they do not have to. Two subcircuits can be positioned close to one another and yet participate in completely unrelated operations.. This is where the "z" identifier comes to play. It can be thought of as identifying a conceptual plane of operation rather than a physical location.

Each subcircuit 130, 131, ..., $CKT_{ZYX}$ of FIG. 1 can be a combinatorial network of logic gates (AND, OR, NOT, etc.) or some other logic circuit through which transitory logic signals propagate. A subcircuit $CKT_{ZYX}$ is defined to have at least one input node, $NI_{ZYX}$, for receiving a stimulus signal and at least one output node, $NO_{ZYX}$, for outputting a responsive output signal.

Conductive nets (e.g., wires) link each respective input node $NI_{abc}$ to an output node $NO_{def}$ or to one of the external points XPi on the chip 100 to thereby define one or more functional circuits on the IC chip 100 (subscripts a, b, c, d, e, f and i are arbitrary designators here). A functional circuit is defined here to comprise two or more subcircuits which are operatively coupled to one another for performing one or more prespecified functions. Clocked scan latches are often interposed between subcircuits and used during a scan test mode to isolate one subcircuit from another.

Two types of scan latches are discussed below; clocked and nonclocked. These are also referred to respectively as clock-sensitive and clock-insensitive scan latches. When clock signals are suppressed from reaching a clock-sensitive scan latch, that latch is defined here as being "desensitized".

A type of nonclocked scan latch referred to as an operating-state-latch (OSL) will be described later. Every scan latch, whether clocked or nonclocked, can be accessed by a scan control unit (SCU) 150 of the chip 100 to force the state of the scan latch either to a logic "1" (high) or logic "0" (low) state. But the states of clocked scan latches (e.g. synchronous T-type or D-type flip flops) can toggle to an unknown state if they receive an unknown number of clock pulses immediately thereafter. During testing, the delivery of clock pulses to clocked scan latches should be controlled to maintain a known state forced upon the latches by the scan control unit (SCU) 150.

In FIG. 1, each scan latch ($SL_{ZYX}$) shown is a clocked D-type flip-flop which has a D input terminal for receiving data, an internal storage means (not shown) for storing data and a Q output terminal for outputting the stored data. Data applied at the D input terminal of the scan latch ($SL_{ZYX}$) is loaded into its internal storage means when a clock pulse is detected at a clock input terminal (>) of the latch. Each scan latch ($SL_{ZYX}$) also has SET and RESET terminals (S and R) for respectively setting the state of its stored data to a logic "1" or resetting it to a logic "0" irrespective of the data on the D input terminal.

In the example illustrated by FIG. 1, a first scan latch $SL_{120}$ is shown receiving an external stimulus signal (DATA IN) from a first external connection point 104 at its D input terminal. During a non-test, normal operating mode of the chip 100, clock pulses pass freely from a second external connection point 103 over an on-chip clock-distributing line 153 and through a first clock-passing AND gate 110 to a clock receiving terminal 154 of the first scan latch $SL_{120}$. In response, the first scan latch $SL_{120}$ stores successive logic states of the external stimulus signal (DATA IN) and forwards them through its Q output terminal to an input node $NI_{130}$ of the first subcircuit 130. First subcircuit 130 outputs a responsive signal at its corresponding output node $NO_{130}$.

The signal developed inside the chip, at internal node $NO_{130}$, passes through a second scan latch $SL_{121}$ during the normal operating mode. The second scan latch $SL_{121}$ is clocked by clock signals passing through a second clock-passing AND gate 111 during the normal operating mode. The signal developed at the Q output terminal of second scan latch $SL_{121}$ is applied to a first input node $NI_{131a}$ of the succeeding subcircuit 131. A second input node $NI_{131b}$ of subcircuit 13 receives a separate input signal from a scannable register $SR_{141}$ to be discussed later. The second subcircuit 131 outputs a signal on its output node $NO_{131}$ in response to the input signals applied at its input nodes, $NI_{131a}$ and $NI_{131b}$. The output signal passes through a third scan latch $SL_{122}$ during the normal operating mode for application to input node $NI_{132}$ of third subcircuit 132.

An arrow terminated line at the output of the third subcircuit 132 indicates that the signal forwarding chain beginning with subcircuit 130 continues from the third subcircuit 132 deeper into the chip 100. The deeper part of the chip which includes more clocked scan latches and subcircuits is not shown.

A second part of the chip 100 is illustrated to comprise subcircuits $140a$, $140b$, ..., $140e$, 141 and 142 (also labelled $CKT_{ZYX}$) connected as a series-parallel network. The latter network includes clocked scan-registers, $SR_{140}$, $SR_{141}$ and $SR_{142}$, provided as shown for isolating subcircuits $140a$, $140b$, ..., $140e$, 141 and 142 from one another for test purposes. Scan register $SR_{141}$ supplies an input signal to node $NI_{131b}$ of subcircuit 131, and thus the first and second signal forwarding chains of IC chip 100 are linked together.

Each of the clocked scan-registers $SR_{ZYX}$ comprises a plurality of clocked scan latches and clock-passing elements combined similarly to the combination circuit formed by the first scan latch $SL_{120}$ and the first clock-passing AND gate 110. These combination circuits, are each referred to here as a "pass-latch unit" (PLU). The PLU's within scan registers $SR_{140}$, $SR_{141}$, $SR_{142}$ are not shown to avoid illustrative clutter in FIG. 1.

Typically, in computer circuits, each scan register has 8, 16, 32 or a higher number of PLU's packed close together. It is desirable to keep the size of all PLU's and their support circuitry as small a possible. IC chip 100 can have as many as 512 or more PLUs distributed across its substrate.

While FIG. 1 shows just two circuit networks, a typical IC chip will contain a much larger number of series/parallel networks interlinked to form a complex structure. The structure can include many multi-input subcircuits such as the illustrated subcircuit 141 and many feedback paths such as formed by subcircuits 141 and 142. PLU's should be appropriately interposed between the subcircuits where possible to isolate them from one another so that the dynamic behavior of each subcircuit can be studied independently.

When chip 100 is in the normal operating mode, many transitory signals are simultaneously passing inside from one subcircuit $CKT_{abc}$ to another subcircuit $CKI_{def}$ and rapidly changing the overall "state" of the chip 100 (a,b,c, ..., f are arbitrary designators here). If an operational fault occurs somewhere deep inside the chip 100, the logic states at the external input and output points (XPi) may not provide enough information to either reveal the existence of the fault or explain why it occurred. This is where the scan control unit (SCU) 150 and its associated scan circuitry is employed to electronically probe internal nodes of the IC chip 100 which are otherwise not easily accessed. Scan control commands and data are fed into the SCU 150 through a scan-in (SI) external connector 101 of chip 100. Scan result data is relayed out through a scan-out (SO) external connector 102 of IC chip 100.

For the sake of example, suppose that when input node $NI_{131b}$ is held at a logic "1" level, subcircuit 131 fails to respond in adequate time to a transitory stimulus applied at its other input node $NI_{131a}$. A dynamic function test could be used to isolate the fault as follows.

At initial time $t_0$, the on-chip scan control unit 150 applies control signals to input buses 158, 161 and 171 of respective clock-passing AND gates 110, 111 and 112 to suppress clock signals from passing to respective scan latches $SL_{120}$, $SL_{121}$ and $SL_{122}$. In accordance with the invention, each of the AND gate input buses 158, 161 and 171 comprises a plurality of m control lines, where m is an integer preferably equal to 2 or 3. When a logic "0" is applied to any one of the m control lines of an AND gate input bus 158, 161 or 171, it disables its corresponding AND gate 110, 111 or 112 from passing a clock signals to its corresponding scan latch. The corresponding scan latch, $SL_{120}$, $SL_{121}$ or $SL_{122}$ is thereby desensitized from responding to clock pulses on the system clock line 153. The scan latch within $SR_{141}$ which drives input node $NI_{131b}$ is similarly desensitized.

This isolates subcircuits 130 and 131 from other subcircuits of IC chip 100. For simplicity it is assumed that only node $NI_{131a}$ will receive a transitory stimulus signal during the DFT. If the second input node $NI_{131b}$ of subcircuit 131 is to simultaneously receive a transitory stimulus signal during the DFT, then scan registers $SR_{140}$ and $SR_{141}$ should be similarly blocked from receiving clock pulses so that subcircuits 140a, 140b, . . . , 140e are further isolated.

After clock pulses are suppressed from reaching scan latches $SL_{120}$, $SL_{121}$, and $SL_{122}$, these scan latches are collectively reset by applying an appropriate reset pulse to their corresponding reset terminals 160, 163 and 173. A reset scheme in accordance with the above-cited copending patent application (SCANNABLE SYSTEM WITH ADDRESSABLE RESET GROUPS) may be used.

A pattern of steady-state ones and/or zeroes is next established at the respective D input terminals and Q output terminals of scan latches $SL_{120}$, $SL_{121}$, and $SL_{122}$, to prepare the circuit for a set of high speed clock pulses soon-to-be applied to scan latches $SL_{121}$ and $SL_{122}$. Scan register $SR_{141}$ is set to supply a steady-state logic "1" to the second input node $NI_{131b}$ as required by the test conditions. Assume for this example that the output level of subcircuit 130 is the same as the level placed at its input node, $NI_{130}$ and the output level of subcircuit 131 is the inverse of the level placed at its first input node, $NI_{131a}$.

First scan latch $SL_{120}$ is set to produce a steady-state logic "1" at its Q terminal which passes through subcircuit 130 thereby presenting a steady-state logic "1" at the D input terminal of second scan latch $SL_{121}$. The second scan latch $SL_{121}$ is left in its reset state thereby presenting a steady-state logic "0" to input node $NI_{131a}$. Output node $NO_{131}$ settles to an opposed steady-state responsive level representing logic "1" generated by subcircuit 131. The third scan latch $SL_{122}$ is left in its reset state thereby storing a steady-state logic "0" opposite to the logic "1" presented at its D input terminal.

The scan control unit (SCU) 150 can detect the stored state of the third scan latch $SL_{122}$ by addressing a scan-point detecting AND gate 113 using scan-addressing bus 181. AND gate 113 has one input terminal 182 coupled to the Q output terminal of third scan latch $SL_{122}$. When AND gate 113 is addressed, it outputs the logic level at its one input terminal 182 to a scan output collecting line 180 which then relays the logic level to the scan control unit 150. SCU 150 thereafter relays the logic level out on the scan-out terminal 102 so that it may be detected outside of IC chip 100 and studied. While not shown, it is to be understood that IC chip 100 has many (i.e., hundreds) of scan points and scan-point detecting elements similar to $NI_{132}$ and gate 113 distributed at preselected points across its substrate. The scan addressing bus 181 coupled to AND gate 113 incidentally comprises a plurality of m' lines where m' is preferably two or three.

The stage is now set for performing a first dynamic function test (DFT1) on subcircuit 131. Subcircuit 131 will be occasionally referred to below also as the Subcircuit-Under-Test or "SubUT" for short. The first dynamic function test (DFT1) will determine the response of subcircuit 131 (SubUT) at a time point, $t_2$, to a "0" to "1" transition, which occurs at a shortly preceding time point, $t_1$, on its first input node, $NI_{131a}$.

Scan control unit (SCU) 150 addresses AND gates 111 and 112 and enables them to pass two clock pulses, one occurring at time point $t_1$ and the second at time point $t_2$, to respective scan latches, $SL_{121}$ and $SL_{122}$. When the first clock pulse arrive at time point $t_1$, the steady-state logic "1" which has been waiting at the D input terminal of second scan latch $SL_{121}$ passes through scan latch $SL_{121}$ to create a "0"-to-"1" transition at input node $NI_{131a}$ of the SubUT, subcircuit 131. The transition at node $NI_{131a}$ occurs at a slightly later time point, $t_1 + t_{SL}$, where $t_{SL}$ is the signal propagating time of $SL_{121}$.

The steady-state logic "1" which has been waiting at the D input terminal of the third scan latch $SL_{122}$ enters the third scan latch $SL_{122}$ at first time point $t_1$ to overwrite the pre-stored logic "0". The ability of output node $NO_{131}$ to provide sufficient steady state charge to toggle the state of third scan latch $SL_{122}$ should be verified in an earlier performed static function test.

In response to the "0"-to-"1" transition produced on its input node $NI_{131a}$ at time point, $t_1 + t_{SL}$, subcircuit 131 (SubUT) is next expected to output an opposed "1"-to-"0" transition at its output node $NO_{131}$ before time point $t_2$. When the second clock pulse arrives at the third scan latch $SL_{122}$ at time point $t_2$, the state of output node $NO_{131}$ is captured in scan latch $SL_{122}$.

After time point $t_2$, the SCU 150 addresses AND gate 113 to detect the state stored in third scan latch $SL_{122}$ and relay it out of IC chip 100 for analysis. This process simultaneously tests two things. First, it determines whether subcircuit 131 did indeed switch its output level from a logic "1" to a logic "0" before second time point $t_2$ in response to the transitory "0"-to-"1" stimulus applied at its input node $NI_{131a}$ at time point $t_1 + t_{SL}$. Second, because the third latch $SL_{122}$ was preloaded with a logic "1" at time point $t_1$, the process tests the ability of subcircuit 131 to output a signal sufficiently strong to toggle the state of succeeding scan latch $SL_{122}$ in the relatively short test period between time points, $t_1 + t_{SL}$ and $t_2$.

The interval between time points $t_1$ and $t_2$ is controlled by an external clock source of variable frequency. This clock source (not shown) is coupled to terminal 103. The duration between time $t_1$ and time $t_2$ is varied as desired over repeated tests to evaluate the dynamic performance of subcircuit 131 under a variety of test conditions.

In a second dynamic function test (DFT2), a reverse transition from logic "1" to logic "0" may be desired at input node $NI_{131a}$ of SubUT 131. In this test, first scan latch $SL_{120}$ is left reset before time point $t_1$ so that subcircuit 130 presents a steady-state "0" to the D input terminal of second latch $SL_{121}$. The second and third scan latches $SL_{121}$ and $SL_{122}$ are each set to store a logic "1" before time $t_1$. At time $t_1$, the steady-state logic "0" generated by node $NO_{130}$ passes through scan latch $SL_{121}$ to generate a "1"-to-"0" transition at input node $NI_{131a}$. Also at time $t_1$, the steady-state logic "0" generated by node NO$_{131}$ enters third scan latch SL$_{122}$ to thereby switch its stored state from a logic "1" to a logic "0", the latter state being opposite to that next expected as the output of subcircuit 131. At time t$_2$, the responsive "0"-to-"1" transition at output node NO$_{131}$ should toggle the state of detecting latch SL$_{122}$ back to "1". The toggled stated is then read out through scan-reading gate 113.

With the above methods, it should be possible to isolate and perform a dynamic-function test on any desired subcircuit CKT$_{ZYX}$ of the IC chip 100. The problem is how to accomplish this without increasing the size of the scan circuitry beyond acceptable levels. The scan control unit 150 and its associated clock-passing AND gates 110, 111, 112, as well as AND gate input buses 158, 161 and 171, should not consume more than approximately one-third of the substrate area of IC chip 100, and more preferably, they should consume less than 30% of the substrate area. This is important in high-density circuits.

Figure 2:
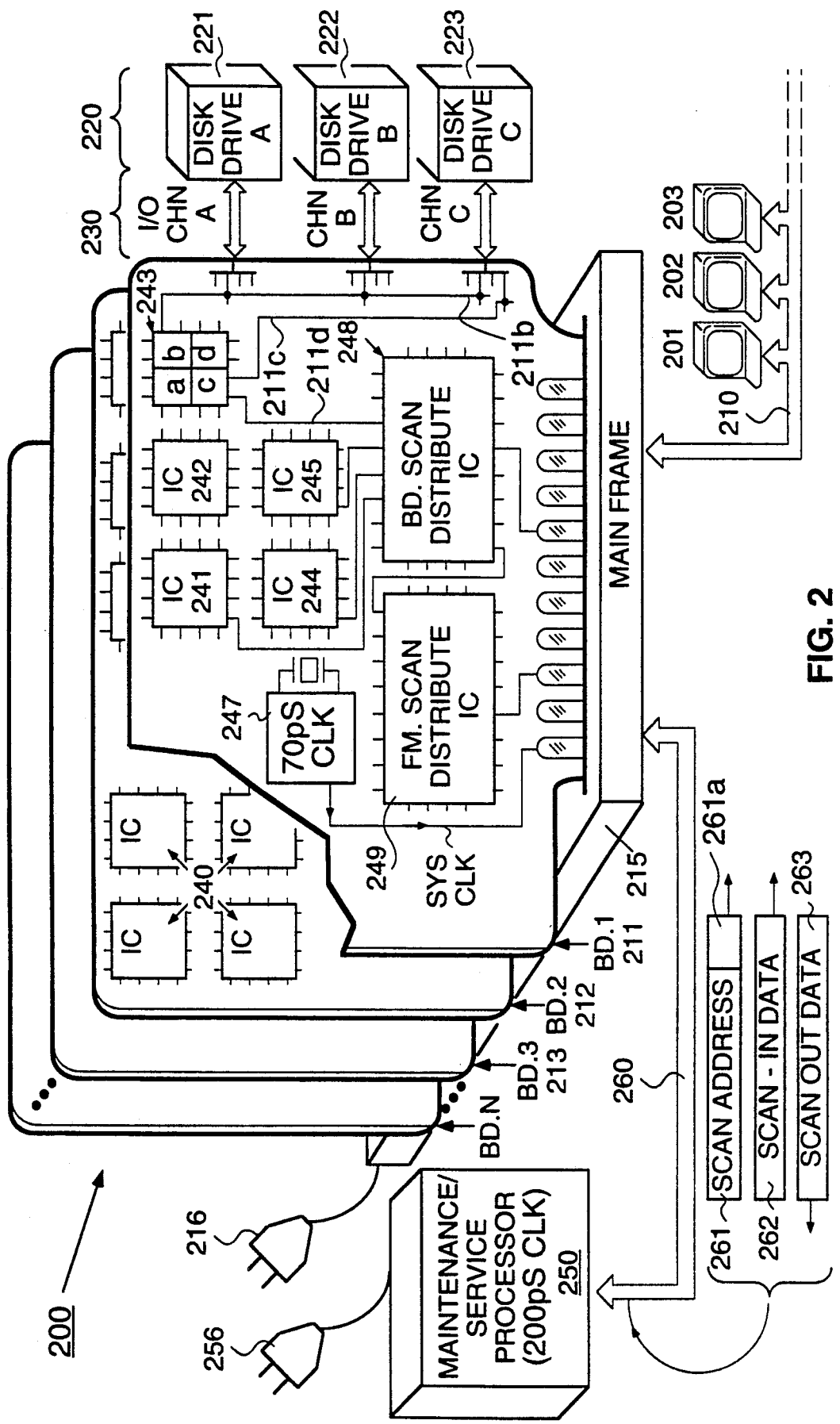
FIG. 2, is a block diagram of a service processor coupled to a scannable mainframe computer system structured for dynamic performance evaluation in accordance with the invention.

Referring momentarily to FIG. 2, a high-density environment is illustrated. A densely-packed, mainframe computer 200 comprises a plurality of heavily-populated circuit boards, BD.1, BD.2, BD.3, ... BD.N. Each of these boards supports a large number (e.g., 100 or more) of high-density IC chips 240. Each of the chips 240 includes a large number (e.g., 256 or more) of inter-linked subcircuits. Preferably each of the IC chips 240 also includes scan test means in accordance with FIG. 1 for testing the dynamic performance of each of its subcircuits.

The details of FIG. 2 will be discussed later. For now, it is sufficient to note that relatively little surface area (e.g., no more than approximately 1%) is allocated on each printed circuit board for supporting wires or other discrete (non-integrated) components that implement the scan testing functions and relatively little area (e.g., no more than approximately 6% to 30%) is allocated on the substrate of each IC chip 240 for supporting scan functions. Because of these constraints, the dynamic function test means of each IC chips 240 preferably has a space-conserving structure in accordance with the next described FIGS. 3A and 3B.

Figure 3A:
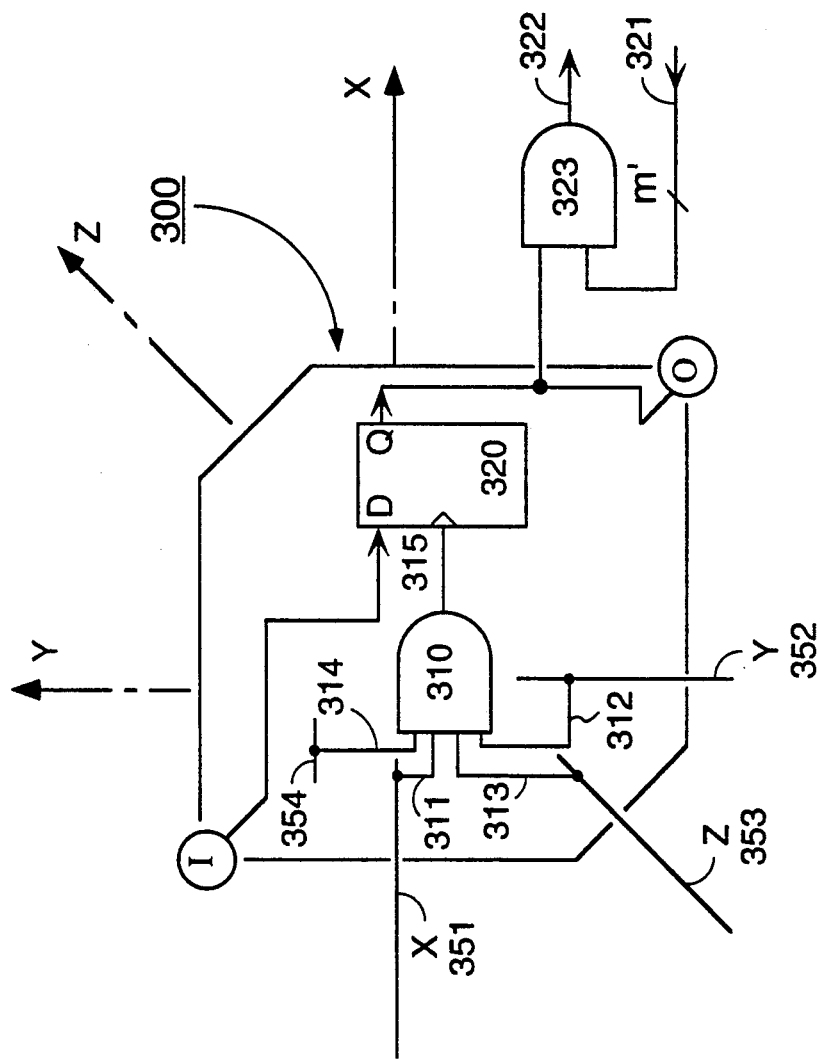
FIG. 3A is a block diagram of a single pass-latch unit (PLU) and its associated X, Y and optional Z directed lines as arranged in accordance with the invention.

FIG. 3A is a schematic diagram showing a single pass-latch unit (PLU) 300 in accordance with the invention. PLU 300 comprises a clock-passing AND gate 310 having an output terminal 315 coupled to the clock-receiving terminal of a clock-sensitive scan latch 320. The clock-passing AND gate 310 is used to selectively pass or suppress the transmission of clock pulses to the scan latch 320 and thus selectively sensitize or desensitize that latch 320.

A first input terminal 311 of the clock-passing AND gate is connected to a first, X-directed line 351 which passes through the unit 300 in an X-direction A second input terminal 312 of the clock-passing AND gate is coupled to a second, Y-directed line 352 which passes through unit 300 in a Y-direction. An optional third input terminal 313 of the clock-passing AND gate is coupled to a third, Z-directed line which passes through the unit 300 in yet a third, Z-direction (which can be in the same plane as that of the X and Y directions) as shown. According to one variation of the invention, the Z-directed line 353 and third input terminal 313 are omitted to reduce the size of PLU 300.

A fourth input terminal 314 of the clock-passing AND gate is coupled to a clock supply line 354. The clock supply line 354 is part of or is operatively coupled to a global clock distribution line (e.g., 153) of the IC chip 240 for receiving system clock pulses. The D-input terminal of scan latch 320 is schematically shown coupled to an input node (I) at the upper left corner of PLU 300. The Q output terminal of the scan latch 320 is schematically shown connected to an output node (0) at the lower right corner of PLU 300. While not shown, it is to be understood that scan latch 320 further receives SET and RESET control signals from an on-chip scan control unit (150' of FIG. 3B) so that its Q output may be selectively forced to a known state. AND gate 323 functions as a scan-point reading means for detecting the state of the Q output terminal of latch 320 and relaying the detected state over line 322 to the on-chip SCU 150' when the on-chip SCU 150' addresses the AND gate 323 over an m'-bit wide bus 321.

While a particular form of pass-latch unit is shown in FIG. 3A, it is to be understood that there are many equivalent forms. The function of the four-input AND gate 310 can be instead realized by a series of AND gates where each gate in the series receives one of the X, Y and/or Z directed lines. Part or all of the function of AND gate 310 can be integrated into latch 320 in the form of so-called clock-enable terminals provided in the latch 320. Other types of signal switching means could be substituted for AND gate 320 to selectively sensitize or desensitize latch 320 to system clock signals in accordance with control signals provided on the X, Y and/or Z control lines.

FIG. 3B illustrates a clock-distribution control matrix 350 which is included in each IC chip 240 in accordance with the invention. The clock-control matrix 350 is distributed across the IC chip 240 and comprises a plurality of pass-latch units and intersecting sets of X, Y and optionally Z-directed lines. Each pass-latch unit is referenced by the symbol, PL$_{XYZ}$, where the subscripts X, Y, and Z identify respective X, Y and Z (if any) lines which are operatively coupled to the clock-passing AND gate 310 of that PLU. A pass-latch unit PL$_{XYZ}$ is said to be "desensitized" when its clock-passing gate 310 blocks clock pulses from switching the state of its scan latch 320 and "re-sensitized" when its clock-passing element is afterwards enabled.

As seen in FIG. 3B, a first plurality of X-directed lines (X1, X2, X3, etc.) intersect at right angles with a second plurality of Y-directed lines (Y1, Y2, Y3, etc.) to define a plurality of matrix intersection points, such as matrix point 355. Each matrix point (e.g. 355) is uniquely identified by its intersecting X and Y-directed lines. A third plurality of Z-directed lines (Z1, Z2, Z3, etc.) run diagonally through the matrix points so that each matrix point may be further distinguished from other matrix points by either its X and Z coordinates or its Y and Z coordinates.

It is to be understood that the X, Y, and Z lines do not have to be straight lines and that they do not have to run at the illustrated angles. The illustrated 0°, 45°, and 90° of the X, Y, and Z-directed lines are merely examples of how a matrix of uniquely identifiable points may be structured. Lines may intersect conceptually instead of physically to identify a particular matrix point. As an example, lines may terminate at a PLU on the periphery of the matrix, without intersecting, but they nonetheless uniquely address that peripheral PLU.

A pass-latch unit PL$_{XYZ}$ is positioned under or near each matrix intersection point (actual or conceptual). The product, $N_p = N_X \cdot N_Y$ represents the maximum number of PLU's which can be uniquely addressed by a matrix where the number of X-directed lines is $N_X$ and the number of Y-directed lines is $N_Y$. The number of uniquely addressable PLU's which need to be included within each IC chip 240 is defined by the chip designer. This number should be less than or equal to the maximum number, $N_P$, that can be supported by the on-chip clock-distribution control matrix 350. By way of example, an IC chip fabricated with Very-Large-Scale-Integration (VLSI) techniques might require as many as 600 or more PLU's, in which case the on-chip clock-control matrix should have at least 600 intersection points.

Each X-directed or Y-directed line consumes a finite amount of surface area on the IC chip. By way of example, each directed line of a VLSI chip can be 1.0 to 0.8 micron wide and as long as 5 millimeters or more. It is preferable to minimize the total number of control lines, as expressed by the sum $S_{XY}=N_X+N_Y$, so that minimal space is consumed by the combination of X-directed and Y-directed lines. Accordingly, the numbers $N_X$ and $N_Y$ should be approximately equal to one another so that, given a fixed number of PLU's to be addressed, the sum $S_{XY}$ is minimized or at least kept relatively small. The difference between the numbers, $N_X$ and $N_Y$, should preferably be no more than one or two. By way of example, when $N_X=24$ and $N_Y=25$, as many as 600 PLU's can be controlled by the clock-control matrix 350.

When $N_X$ and $N_Y$ are equal, matrix 350 may be considered a square matrix wherein the combined number of X and Y-directed lines $S_{XY}$ is twice the square root of $N_P$. If the Z-directed lines are included, the combined number of X, Y, and Z lines is approximately 3.5 times the square root of $N_p$.

Each of the X, Y and Z-directed lines in matrix 350 is driven by an operating state latch (OSL). An OSL is a type of scan latch which can be addressed by the on-chip SCU 150' and set or reset to thereby place the OSL in a known logic "1" or logic "0" state. Unlike clocked scanned latches, an OSL does not switch states in response to system clock pulses. It is clock-insensitive and thus it is preferentially used by the SCU 150' to "configure" other parts of the IC chip 240 into clock-independent operating modes or "configurations" which do not change in response to system clock pulses. The on-chip SCU 150' of FIG. 3B is similar to the scan control unit 150 of FIG. 1 in that SCU 150' receives commands and scan-in data (SI) from an external test means and outputs scan-out data (SO) to the external test means (not shown) but the earlier mentioned means for selectively enabling and disabling each clock-passing AND gate (310) is now broken out as the matrix-surrounding arrays of OSL's, 360, 370 and (optionally) 380.

Each OSL, such as the three-plus gate version shown in FIG. 3C (described below), occupies a finite amount of substrate area. Since one line-driving OSL is used for driving one line in the clock-controlling matrix 350, the total number of OSL's required for supporting the matrix 350 is equal to either the sum $S_{XY}=N_X+N_Y$, or the sum $S_{XYZ}=N_X+N_Y+N_Z$, depending on whether the optional Z lines are included ($N_Z$ being the number of additional Z-directed lines). This total number of line-driving OSL's defines a substrate area overhead figure which represents an additional amount of substrate area consumed for supporting the dynamic function test operations. It is preferable to keep this overhead figure as low as possible.

In one embodiment of the invention, where the clock-control matrix 350 is a square matrix not including the Z-directed lines, the total number of line-driving OSL's (in respective arrays of X-OSL's and Y-OSL's, 360 and 370) is limited to no more than twice the square root of the number of PLU's.

In another embodiment of the invention, where all the Z-directed lines and their corresponding array of Z-OSL's 380 are included, the substrate overhead figure increases by approximately an additional 1.5 times the square root of the number of PLU's. This additional overhead can be reduced by omitting Z-directed lines and their associated line-driving OSL's where not needed.

FIG. 3B shows the on-chip SCU 150' coupled by way of an m"-bit wide bus 367 to the SET (S) and RESET (R) control terminals of individual line-driving OSL's in arrays 360, 370 and 380 so that the SCU can selectively set or reset each OSL. Array 360 comprises OSL's 361, 362, 363, etc. for controlling the X-directed lines. Array 370 comprises OSL's 371, 372, 373, etc. for controlling the Y-directed lines. And array 380 comprises OSL's 381, 382, 383, etc. for controlling the Z-directed lines. When appropriate ones of the line-driving OSL's are set or reset, patterns of enabled and disabled clock-passing elements can be created such that the above-described DFT methods may be carried out on any one of first through sixth interlinked subcircuits, 331-336, shown belonging to a functional circuit 330 of the integrated circuit chip 240.

Figure 3C:
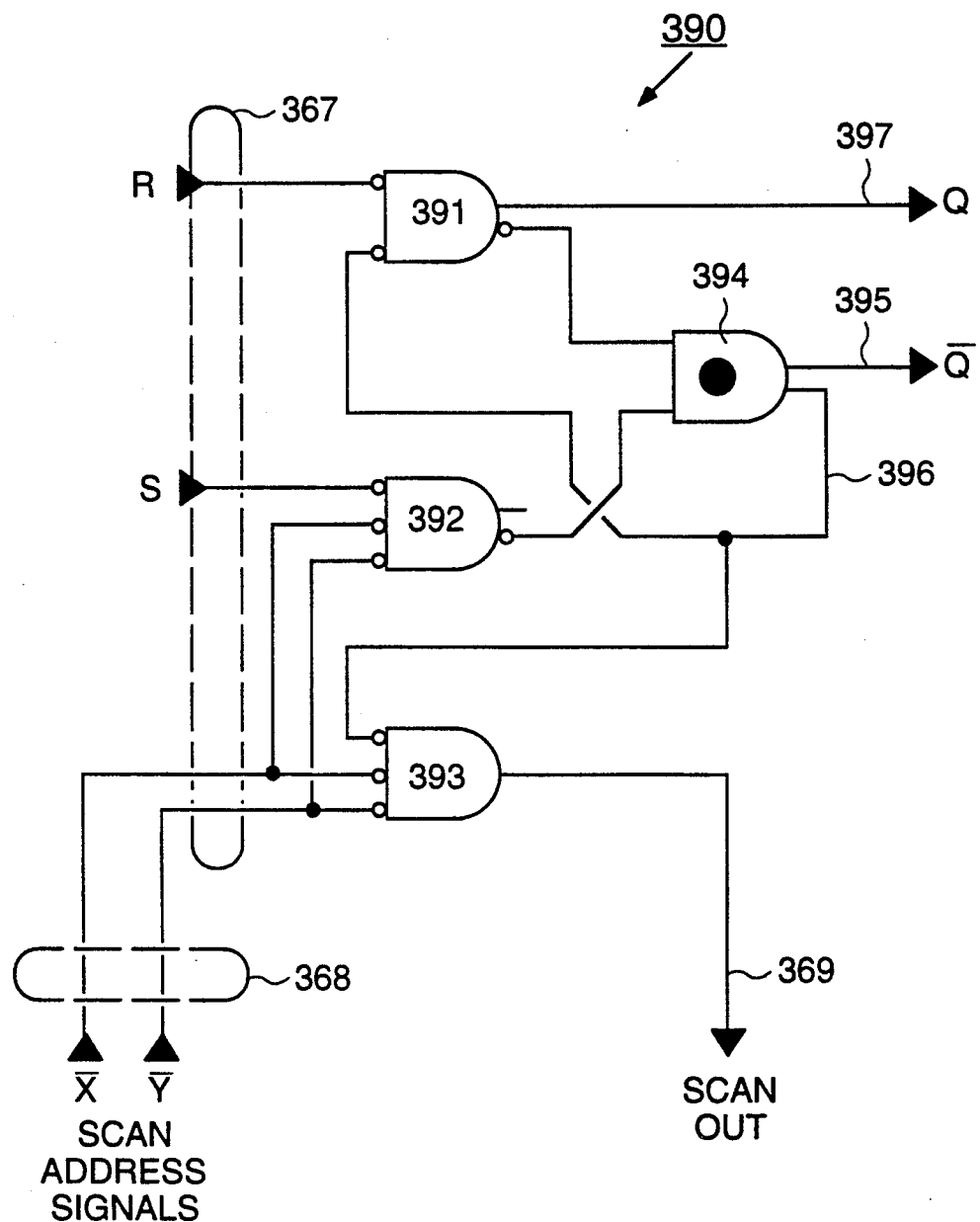
FIG. 3C is a schematic diagram of a line-driving OSL which utilizes a three-gate ECL structure.

Referring briefly to FIG. 3C, each line-driving OSL 361, 362, 363, etc., preferably has a structure such as shown at 390. Components 391, 392 and 393 are logic AND gates implemented with emitter-coupled logic (ECL) technology. Component 394 is an AND gate formed by dot-connecting collectors of gates 391 and 392 as is well known in the art. It includes a current splitter for outputting two $\overline{Q}$ signals, one as an output 395 of the latch and the other as a feedback signal on line 396. Because of the dot connection, an equivalent of four logic gates 391-394 is realized in a space occupied by essentially three gates, 391-393. The set and reset terminals are correspondingly labelled as S and R. Address bus 368 receives $\overline{x}$ and $\overline{y}$ (column and row) select signals from the SCU 150' for scanning out the state of OSL 390. If the S terminal is simultaneously at logic "1" when OSL 390 is addressed, gate 392 sends a logic "0" to gate 394 forcing the $\overline{Q}$ terminal 395 to logic "0". The feedback path 396 from gate 394 to gate 391 drives the Q terminal 397 to logic "1". Line 369 returns the state of the OSL 390 to the SCU 150' when its x and y lines (367) are selected. The R terminal drives the Q output terminal to logic "0" independently of bus 368. Simultaneously a logic "1" is transmitted to dot gate 394, driving the $\overline{Q}$ terminal to logic "1". It is to be understood, of course, that the present invention reduces the number of OSL's needed for driving the X, Y and Z control lines irrespective of the internal structure of each line-driving OSL, and thus its advantages are realized with all types of OSL's.

Referring to FIG. 3B again, circuit 330 is drawn to illustrate various ways in which subcircuits might be disposed relative to the clock-distribution control matrix 350 and to illustrate methods by which the dynamic response of these subcircuits might be tested. As the test procedure for each of subcircuits 331-336 is described below, the subcircuit under test is periodically referred to as the SubUT.

The first subcircuit 331 is shown to have one input terminal coupled to the output node (O) of pass-latch unit $PL_{111}$. The output terminal of subcircuit 331 is coupled to the input node (I) of pass-latch unit $PL_{122}$. While not shown, it is assumed here that the input node (I) of $PL_{111}$ is driven either directly or indirectly by a clock-insensitive scan latch or a chip input pin such that the state of the input node (I) of $PL_{111}$ may be forced to a known "1" or "0" either by the SCU 150' or an off-chip test means. Subcircuit 331 is therefore situated such that it can be easily isolated from all other subcircuits (332–335) for the purpose of testing its dynamic behavior.

To test subcircuit 331, the OSL's of arrays 360 and 370 and those of 380 (if they are present) are first all reset with a global reset command issued from SCU 150'. This densensitizes all the clocked latches 320 of the PLU's in matrix 350. Then, an appropriate pattern of steady-state ones and zeroes is loaded into the scan latches of $PL_{111}$ and $PL_{122}$ as well as into the scan latch which drives the input node (I) of $PL_{111}$. OSL's 371 and 372 are individually set to place logic "1" levels on their respective Y1 and Y2 lines. OSL's 381 and 382, if they are present in the circuit, are individually set to place logic "1" levels on their respective Z1 and Z2 lines. Finally, OSL 361 is individually set to place a logic "1" on the X1 line for a period of at least two clock pulses (and in some test environments, such as where other parts of the chip and/or system continue to receive system clock pulses, only two clock periods). This re-sensitizes $PL_{111}$ and $PL_{122}$. Two closely spaced clock pulses are applied to the global clock line 153 (at respective time points $t_1$ and $t_2$) and the response of subcircuit 331 (SubUT) is scanned out from $PL_{122}$.

It should be noted that the Z1 and Z2 lines are not necessary for isolating the subcircuit under test, SubUT 331 from all the other subcircuits. The input and output nodes of subcircuit 331 happen to be conveniently connected to the PLU's of a single control line (X1) so that the X1, Y1 and Y2 lines can be used to isolate subcircuit 331 from other parts of circuit 330 without assistance from the Z-directed lines.

The second subcircuit 332 is similarly placed in a convenient manner for dynamic testing. Its input terminal is coupled to the output node (O) of pass-latch unit $PL_{122}$ and its output terminal connected to the input node (I) of pass-latch unit $PL_{223}$. The dynamic behavior of subcircuit 332 may therefore be tested by activating the X1 and X2 lines, the Z2 and Z3 lines and the Y2 line, while keeping all other lines deactivated as the test clock pulses are applied. Since the two pass-latch units, $PL_{122}$ and $PL_{223}$, are both responsive to the Y2 control line, the X1 and X2 control lines are sufficient for re-sensitizing the two PLU's while keeping surrounding PLU's desensitized to system clock pulses. The Z2 and Z3 control lines are not needed for this function.

The third subcircuit 333 is differently situated. It has a first input terminal $NI_{333a}$ coupled to the output node (O) of $PL_{122}$, a second input terminal $NI_{333b}$ coupled to the output node $NO_{334}$ of fourth subcircuit 334 and its own output terminal $NO_{333}$ coupled to the input node (I) of $PL_{234}$.

Assume for the moment that input nodes $NI_{334b}$ and $NI_{334c}$ of fourth subcircuit 334 do not exist. Fourth subcircuit 334 has only one input node $NI_{334a}$ for this particular case, and we wish to test the response of third subcircuit 333 in combination with the fourth subcircuit 334 to a plurality of transitory stimulus signals developed simultaneously at both input node $NI_{333a}$ and input node $NI_{334a}$ (The SubUT is 333 plus 334 and it has input nodes, $NI_{333a}$ and $NI_{334a}$.) The four control lines, X1, X2, Y2 and Y3 are activated after appropriate steady-state levels are established in the four pass-latch units, $PL_{122}$, $PL_{133}$, $PL_{223}$ and $PL_{234}$, to sensitize these pass-latch units, generate transitions at input nodes, $NI_{333a}$ and $NI_{334a}$, and capture the result at output node $NO_{333}$. $PL_{223}$ does not participate in the DFT but it is sensitized parasitically because it shares the respective X, Y and Z-directed lines of $PL_{234}$, $PL_{122}$ and $PL_{133}$.

If the Z-directed lines were not included in the control matrix 350, the activation of just the four control lines, X1, X2, Y2 and Y3, would of itself, re-sensitize the four pass-latch units, $PL_{122}$, $PL_{133}$, $PL_{223}$ and $PL_{234}$ after a global reset, allowing them to respond to clock signals. When the Z-directed lines are further included in the circuit, then lines, Z2, Z3 and Z5 are also activated to re-sensitize the four pass-latch units. Clock pulses are then applied to the scan latches of the four re-sensitized pass-latch units, $PL_{122}$, $PL_{133}$, $PL_{223}$ and $PL_{234}$ to thereby generate the transitory stimulus signals and capture the response of the SubUT, which in this case is the combination of third and fourth subcircuits 333 and 334.

Suppose as a second case, that the second and third input nodes $NI_{334b}$ and $NI_{334c}$ of fourth subcircuit 334 do exist, but this time, it is desirable to test the dynamic response of just the third subcircuit 333 (SubUT) to a transitory stimulus at only its first input node, $NI_{333a}$. The level on its other input node $NI_{333b}$ should not change during the test.

Unfortunately, in the given example, the state of the second input terminal $NI_{333b}$ is dependent on the state of fourth subcircuit 334 and no means is provided for directly isolating $NI_{333b}$ from $NO_{334}$. To assure that an undesired transient is not transmitted to input node $NI_{333b}$ during the dynamic function test, all input terminals of fourth subcircuit 334 should be blocked from receiving or responding to transitory signals during the DFT.

First input terminal $NI_{334a}$ of the fourth subcircuit 334 is connected to the output node (O) of $PL_{133}$. $PL_{133}$ may be desensitized during the dynamic function test by holding the Z3 line at logic "0". Thus, with the assistance of the Z-directed line, Z3, it is relatively easy to eliminate the danger that a transitory signal may pass from $PL_{133}$ through fourth subcircuit 334 to third subcircuit 333 (SubUT) at the time of the DFT.

Second input terminal $NI_{334b}$ of fourth subcircuit 334 is connected to the output node (O) of $PL_{335}$. $PL_{335}$ may be desensitized during the dynamic function test by holding either of the Z5 and X3 lines at logic "0". So the Z5 and X3 lines present two ways by which fourth subcircuit 334 may be isolated from sixth subcircuit 336 (the latter drives the I node of $PL_{335}$).

The connection of a third input terminal $NI_{334c}$ belonging to the fourth subcircuit 334 is not shown so that a number of possible scenarios can be discussed.

First, suppose that the third input terminal $NI_{334c}$ either does not exist or it is tied to a fixed voltage (i.e., ground). Then there is no problem. The possibility of spurious transients passing to $NI_{333b}$ is blocked off completely at the desensitized pass-latch units, $PL_{133}$ and $PL_{335}$.

Second, suppose that fourth subcircuit 334 behaved like an AND gate, in that a logic "0" at input node $NI_{334a}$ is sufficient to block transitory signals at all other inputs of fourth subcircuit 334 from reaching third subcircuit 333 (the SubUT). The state of third input terminal NI$_{334c}$ is therefore a don't care.

Third, suppose that the third input terminal NI$_{334c}$ is directly driven by a not-shown OSL or by a PLU (PL$_{111}$ for example) which has been desensitized such that it does not respond to system clock signals during the DFT. The state at the third input terminal NI$_{334c}$ then be conveniently fixed as desired through the scan system by setting or resetting that clock-insensitive scan latch.

Finally, suppose the third input terminal NI$_{334c}$ is driven by yet another subcircuit (not shown) without an interposed scan latch. One could trace back through the wiring of that other subcircuit (not shown) to see if transients at its inputs could be blocked by desensitizing further PLU's so that the unshown subcircuit does not output transitory signals during the DFT. If this is not successful, one could trace back through even more preceding levels of subcircuits to find a way of suppressing undesired transients. And if it is not possible to suppress undesired transients by desensitizing PLU's, one could load appropriate states by way of scanning into a prior two levels or even more preceding levels of subcircuits so that when these preceding levels do respond to clock signals during the DFT, they maintain their original states and the effect is as if they did not respond to the clock signals.

It is seen from the above scenarios that the presence of the Z3 and Z5 lines made it possible to immediately block transitory signals from reaching input nodes NI$_{334a}$ and NI$_{334b}$ of the fourth subcircuit without having to trace back through preceding subcircuits (i.e. 336) of functional circuit 330 and without having to compute the behavior of these preceding subcircuits. PL$_{133}$ is desensitized by Z3 even though both X1 and Y3 have to be at logic "1" to conduct the DFT. The only place where a trace back was conducted was for the third input node NI$_{334c}$ of subcircuit 334 and this was necessary only in the relatively unlikely case where transient signals at NI$_{334c}$ could not be suppressed by desensitizing one of the PLU's directly coupled to 334.

When the IC chip 240 is designed, its functional circuits (such as circuit 330) are preferably intercoupled with the scan latches of control matrix 350 so that transitory signals can be blocked at each subcircuit input node NI$_{XYZ}$ by connecting a PLU directly to the input node. Sometimes this is not possible. In such a case it is preferable to have PLU's connected to all input nodes of a preceding level of subcircuits, so that if a trace back is necessary, the trace back will not have to flow through more than one preceding level of subcircuits. If that is not possible, then the PLU's should be arranged to halt the trace back as to as few preceding levels of subcircuits as possible. On average, the need for a trace back should be relatively rare and thus, little compute time will be needed for configuring each IC chip 240 to prepare that IC chip for a dynamic function test.

A further advantage of control matrix 350 is that DFT's can be simultaneously performed on plural subcircuits where conditions allow. The dynamic behavior of fifth subcircuit 335 can be tested, for example, at the same time first or second subcircuits, 331 and 332, are being tested.

It was mentioned that a variant embodiment of the invention leaves out some or all of the Z-directed lines. In this case, substrate area is saved but Z lines such as the Z3 might not be available for densensitizing a passlatch unit such as PL$_{133}$ when a quadrant such as the X1, X2, Y2, Y3 quadrant is re-sensitized for testing. It becomes more difficult to isolate a diagonally coupled subcircuit such as 333. If spurious transitory signals can not be suppressed with an immediately adjacent Z-directed line, a greater burden is placed on computational methods for finding alternate ways to suppress the undesired transitory signals (e.g., from output terminal NO$_{334}$) from reaching the subcircuit under test (e.g., SubUT 333). The trace back method may be used as described above, but it may have to be carried out over more preceding levels of subcircuits and/or for many more input nodes. For example, if line Z3 were not included in FIG. 3B then a trace back would have to be conducted for input node NI$_{334a}$ as well as for NI$_{334c}$.

There is a trade off between eliminating the Z lines to conserve space on the one hand and increasing the burden placed on computational methods on the other hand for finding alternate ways to suppress spurious transients from reaching the subcircuit under test (SubUT). Depending on the testing environment, it might be more advantageous to save substrate area and spend more computational time figuring out how to suppress undesired transients with the trace-back technique or it might be conversely more advantageous to sacrifice some substrate area and employ the Z lines so that less time is spent in tracing backwards through the circuit 330.

If IC chips 240 are being tested individually (chip level testing) or only at the board level, it may be advantageous to leave the Z-directed lines out. If, however, an on-line testing procedure is contemplated where the dynamic behavior of subcircuits is to be studied at the system level, and the testing is to occur on a time-stealing user-transparent basis while the System Under Test (SUT) is up and running, so that systems users are left unaware that testing is going on, then the presence of the Z-directed lines may simplify the job of test software in finding ways to suppress spurious transients from reaching the subcircuit under test (SubUT). Less time is spent performing computations when the job of the test software is simplified in this way and, as a consequence, precious seconds or split-seconds can be shaved off from the on-line time-stealing test procedures.

As mentioned earlier, FIG. 2 illustrates a high-density environment in which subcircuits within many logic chips may have to be tested for dynamic response faults. Mainframe computer 200 services multiple users, 201, 202, 203, etc. whose terminals are coupled to the mainframe computer by way of communications network 210. The mainframe computer 200 connects to a plurality of data storage and/or data processing peripherals 220 by way of a corresponding plurality of input/output channels 230. In the illustrated example, the peripherals 220 include first and second disk drive units, 221 and 222 (also denoted as drive A and drive B), as well as a tape drive unit 223 (also denoted as drive C). Respective I/O channels, A, B and C, couple drives A, B and C to the mainframe computer 200.

While not shown, it is to be understood that computer 200 comprises other functional units of the type normally found in a mainframe including an Arithmetic Logic Unit (ALU), Memory Management Unit (MMU) and so forth.

The mainframe users 201, 202, 203, etc., expect that all functional units of the mainframe computer 200, the peripherals 220 and the I/O channels 230 will be continuously available for handling their data processing needs in a reliable, error-free manner. To meet this expectation, a maintenance/service processor 250 is provided for continuously testing various parts of the mainframe computer system, for diagnosing problems and for reconfiguring subsystems of the mainframe or correcting erroneous states so that faulty operations can be automatically uncovered and eradicated. The service processor (hereafter also SVP) 250 includes a power supply 256 which is independent of a corresponding power supply 216 servicing the mainframe computer 200. A scan-testing bus 260 couples the service processor (SVP) 250 to scannable circuitry within the mainframe 200. Scan bus 260 carries scan-address signals 261, scan-input data signals 262 and scan-output signals 263 between the SVP 250 and a large plurality of scannable, high-speed integrated circuit chips 240 (including IC chips 241-249) provided within the mainframe computer 200. The scan bus 260 allows the SVP 250 to access internal circuitry within each mainframe chip 240 so that the operability of internal subcircuits within each of these IC chips 240 may be tested and verified or corrected by the independent SVP 250.

The IC chips 240 (including 241-249) are each implemented with emitter coupled logic (ECL) to operate at switching speeds in the range of 70 picoseconds (pS) to 80 pS. Each chip 240, 241-249 is fabricated with very large scale integration (VLSI) technology to provide as many as 15,000 or more logic gates within a 17 millimeter-square ceramic package having as many as 316 external connection terminals (pins). Some of the chips 240 consist entirely of random logic gate circuitry. Others of the chips 240 each contain up to 32 kilobits (Kb) of on-chip static random-access-memory (SRAM) in combination with up to 8,000 on-chip logic gates. Still others of the chips 240 can contain up to 64 Kb of SRAM in combination with 3.5K of logic gates (K=1024).

Approximately 30% or less of the substrate area in each IC chip 240 is allocated for scan-testing functions while the remaining 70% or more is dedicated to supporting normal-mode (non-test) circuit operations. Each IC chip 240 includes dynamic function testing means in accordance with that of FIG. 3B. In some of chips 240, part or all of the Z-directed lines and Z array of OSL's 380 are omitted. The normal-mode circuits of IC chips 240 are typically clocked by periodic clock signals having a 7 nanosecond (nS) to 14 nS period (70-80 pS switching time). Portions of the scan-testing circuitry not in direct series with the normal operating mode circuits are typically clocked by slower clock signals having a 50 nS period (220 pS switching time).

A plurality of glass ceramic printed circuit boards (with up to 52 layers each) support the mainframe IC chips 240 and connect one to the next. The boards 211, 212, 213, etc., (also labelled as BD.1, BD.2, . . . BD.N) plug into a mainframe rack 215 which supports the boards and couples one to the next. There are typically six to sixteen printed circuit boards in the mainframe computer 200 with each printed circuit board (211) supporting as many as 144 high-speed IC chips 240. Each board (211) has approximately 4000 to 7200 contacts connecting it to the mainframe rack 215. A relatively small fraction (i.e., no more than 50 or 1.25%) of these contacts carry the signals of the scan test bus 260. The scan test subsystem makes it possible to test subcircuits of the mainframe without removing boards or otherwise mechanically interfering with them.

The service processor 250 is housed separately from the mainframe computer 200, is separately powered (256), and is fabricated with VLSI ECL gate array technology packaging approximately 4,480 logic gates on each of a plurality of 128 pin IC chips (not shown) which operate at switching speeds of approximately 220 pS. This slower but more mature technology is employed to assure the reliability of the SVP 250.

The scan address signals 261 output from the SVP 250 identify each subcircuit of the mainframe 200 according to which board it is mounted on, which IC chip 240 it is packaged within and according to where within the identified chip the subcircuit is located. The mainframe 200 includes one or more frame-scan distribution chips 249 for distributing scan address and scan-input data signals (261 and 262) to the individual boards (211, 212, etc.) and for collecting scan-output data signals 263 from the individual boards. Each board (i.e., 211) includes a board-scan distribution chip 248 for similarly distributing scan address and scan input data signals to each of the IC chips 240 on the board and collecting scan-out data signals from the chips of that board.

Each IC chip 240 is defined to have approximately 600 scan points ($SP_{ZYX}$) and approximately 600 scan latches ($SL_{ZYX}$) within it. Each of the scan address signals 261 output from the service processor 250 includes a 10 to 11 bit long IC address field 261a for defining a scannable address space within each IC chip 240 having as many as 1,024 to 2,048, logical scan addresses. Means are provided within this context for individually addressing each OSL 361, 362, 363, etc., of the X, Y, and optional Z arrays 360, 370, and 380 (see FIG. 3B) and setting or resetting them as desired.

An example of a maintenance and service problem will help to explain the operations and advantages of a scan system in accordance with the present invention. Circuit board 211 is shown supporting a plurality of IC chips, 241, 242, 243, 244, 245, etc., included among the chips 240 of the mainframe 200.

This plurality of chips 241-249 includes a board scan distribution chip 248 for distributing and collecting scan signals across the board 211, a frame scan distribution circuit 249 for distributing and collecting scan signals across the frame rack 215 and a clock generating circuit 247 for generating and distributing system clock signals to all parts of the mainframe 200. In one embodiment, the clock generating circuit 247 responds to scan address signals and varies the number and rate of the system clock pulses accordingly. It can be commanded over the scan bus to issue just two clock pulses at time points $t_1$ and $t_2$ where the duration $t_1-t_2$ varies in response to software generated commands.

For the example, it is assumed that IC chip 243 is part of an I/O communications subsystem in the mainframe 200 and that this IC 243 can be conceptually partitioned into four functional compartments, 243a, 243b, 243c, and 243d. Compartment 243b is responsible for providing circuit functions critical to the operability of all I/O channels A, B and C. Compartment 243c is responsible for providing circuit functions critical only to the operability of I/O channel C. Compartments 243a and 243d support unrelated other functions. I/O channels A and B can continue to operate even if the circuits in compartments 243a, 243c or 243d fail.

The tight coupling between compartment 243b and all of I/O channels A, B and C is indicated by the interconnections of board bus 211b to these I/O channels. The tight coupling between IC compartment 243c and only I/O channel C is indicated by board bus trace 211c. The coupling between all the circuitry within IC 243 and the board scan distribution circuit 248 is indicated by board bus trace 211d.

For this example, it is further assumed that, because of overall system requirements, normal circuit operations within IC chip 243 can not be suspended for any continuous period of more than 800 milliseconds (mS). If the 800 mS limit is obeyed, then sub-second suspensions of operations within IC 243 will be transparent to the end users 201, 202, 203, etc. and scan test procedures can be carried out in the background without disrupting normal operations. On the other hand, if normal circuit operations within IC 243 are halted for a continuous period longer than 800 mS, each of the peripheral devices 220 will independently disconnect itself from its respective I/O channel 230 and the end users 201, 202, 203, etc. will lose access to data stored in one or more of these peripheral devices 220. Such disconnection is undesirable.

When the SVP 250 scans a subcircuit to test its static functionality (SFT), the normal mode clocks to the subcircuit have to be halted. This allows test vectors to be loaded into scan latches through the set and reset (S and R) terminals as earlier described. The maintenance/service processor 250 should try to limit the time consumed by all its test procedures so that no one procedure halts any of the I/O subcircuits in the mainframe ICs 240 for a continuous period greater than 800 mS. This way, undesirable disconnects will be avoided.

Sometimes it is not possible to complete a test procedure within the 800 mS time limit. In such cases, it is preferable to confine the disruptions created by such over-long test procedures to only those subcircuits which have to be tested. Other subcircuits which do not need to participate in the test should be able to continue their operations undisturbed. In accordance with the present invention, and the addressable group resets concept described in the above-cited copending patent application of Robert Edwards, et al. (SCANNABLE SYSTEM WITH ADDRESSABLE SCAN RESET GROUPS), group resets are applied to some of the OSL's but not others in the X, Y, and Z arrays 360, 370, and 380 in order to desensitize PLU's in a subregion of matrix 350 while allowing clock pulses to continue to pass to the scan latches of other PLU's outside the blocked region. By way of example, if OSL's 361 and 371 (FIG. 3B) participate in a group reset, while OSL's 362, 363, 372, 373, and 381-383 do not participate, then only the peripheral subregion containing $PL_{111}$, $PL_{122}$, $PL_{133}$, $PL_{212}$, and $PL_{313}$ is desensitized. Clocks continue to pass in the other PLU's. This helps to confine disruptions to only the subcircuits which must participate in a particular static function test or dynamic function test (SFT or DFT).

Suppose that IC 243 operates properly when it is first fabricated and mounted onto circuit board 211. However, due to a complex set of interactions between the design of chip 243, its location on the printed circuit board 211 and thermally-generated stresses which develop only after a long period of time, intermittent errors begin to creep into the data transmissions across I/O channel C and the number of transmission retries increases by a small but significant amount. System operators do not yet know that this is the problem. They do not even know whether the cause of the problem lies in the mainframe 200 or in the peripheral tape drive 223.

First the subcircuits of compartment 243c are blocked out and tested for static and/or dynamic function faults. Compartments 243a, 243b, and 243d are allowed to continue receiving clock signals, and, thus, these compartments remain in the normal operating mode, while only compartment 243c is placed in the scan test mode. I/O channels A and B thus continue to operate normally while the operation of channel C is disrupted temporarily as compartment 243c is being tested.

It is sometimes possible to predict failure of a subcircuit in advance because the dynamic performance of the subcircuit deteriorates over time. Service processor 250 can be programmed to periodically perform dynamic function tests on each subcircuit of the mainframe 200 and to record a history of degradation in dynamic function performance. If an undesirable trend is detected in the dynamic performance of a subcircuit, this event is automatically flagged out to system operators so that they can replace the faulty subcircuit during off-peak hours.

Figure 4:
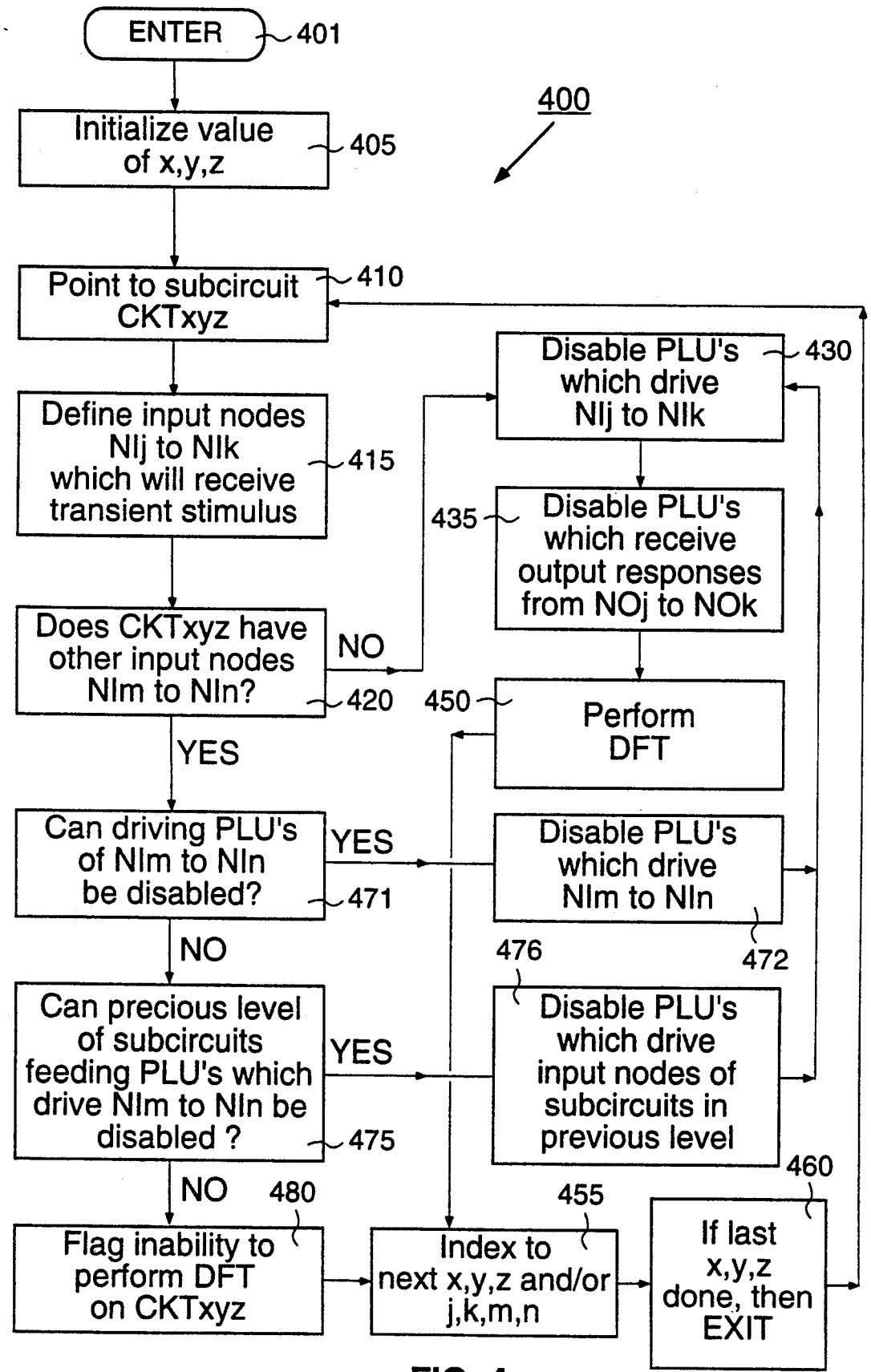
FIG. 4 illustrates a flow chart of an automated DFT in accordance with the invention.

FIG. 4 is a flow chart of a computer-automated process which may be used to carry out a plurality of dynamic function tests in accordance with the invention. The process 400 may be implemented in the software of the service processor 250 shown in FIG. 2 or it may be otherwise implemented in another computerized test fixture (not shown) which tests a circuit in accordance with the invention either at the chip level, the board level or the system level.

Process 400 begins at step 401. At step 405, a first set of X,Y and Z coordinates are chosen from a table of test parameters (not shown). At step 410 the selected coordinates are used to designate a subcircuit, $CKT_{XYZ}$, as the current subcircuit under test (SubUT). At step 415, one or more input nodes, $NI_j$ to $NI_k$ are designated as input nodes which will simultaneously receive one or more transient stimulus signals. The identification of these input nodes is also drawn from the table of test parameters (not shown). At step 420, the structure of the chosen subcircuit $CKT_{XYZ}$ is analyzed to determine whether it has additional input nodes, $NI_m$ to $NI_n$ which are to be blocked from receiving transient signals during the test.

If the answer at step 420 is NO, then the process 400 proceeds to step 430 where the pass-latch units which drive input nodes $NI_j$ to $NI_k$ are desensitized by appropriate setting of OSL's in the clock-control matrix 350. A preceding level of PLU's which determine the steady-state levels delivered to the D input terminals of the input PLU's (driving $NI_j$ to $NI_k$) are also desensitized at step 430. At step 435, the process further determines from the table of test parameters (not shown) which output nodes $NO_j$ to $NO_k$ are to be studied for their response to the transient stimulus signals provided to input nodes $NI_j$ to $NI_k$. The corresponding PLU's of these output nodes are further desensitized.

At a following step 450, the input and output PLU's of the subcircuit under test $CKT_{XYZ}$ are re-sensitized and clock pulses are applied in accordance with the earlier described dynamic function test (DFT). The results are recorded in a history file (not shown) which is later reviewed to detect historical trends.

After the DFT of step 450 is performed, the process proceeds to step 455 where it indexes through the table of test parameters (not shown) to a next set of XYZ coordinates and/or a different set of input or output coordinates j, k, m, n. At step 460, a test is performed for an exit condition and if the exit condition is FALSE, the process returns to step 410 to reset the OSL's and perform yet a further DFT.

If the answer at step 420 had been YES, the process proceeds to step 471 where it determines whether PLU's driving the other input nodes, $NI_m$ to $NI_n$ can be desensitized to thereby block spurious transients from entering these other input nodes $NI_m$ to $NI_n$ during the DFT. If YES, then the process proceeds to step 472 where these driving PLU's are desensitized. Thereafter, steps 430–460 are performed as before.

If the answer at step at 471 had been NO, then the process traces backwards through the circuit at step 475 to find alternate ways for blocking transients from reaching the other input nodes $NI_m$ to $NI_n$. The alternate ways include desensitizing PLU's of preceding levels of subcircuits and/or scanning states into preceding levels to maintain their states even though they respond to system clock pulses. If such other ways can be found, the process proceeds to step 476 where the appropriate PLU's are desensitized and set or reset as necessary. Thereafter, steps 430–460 are performed as before.

If the results of step 475 are such that spurious transients cannot be blocked from the other input nodes $NI_m$ to $NI_n$, then at step 480, the computer automated process 400 generates a flag indicating its inability to perform a valid dynamic function test on the chosen subcircuit $CKT_{XYZ}$. From there, the process may skip forward to step 455 or, alternatively, perform the dynamic function test on the chosen SubUT even though the results are flagged as being invalid. The process ends when the last of the subcircuits $CKT_{XYZ}$ has been tested as indicated at step 460.

The steps of sensitizing and desensitizing various PLU's (steps 430, 435, 472 and 476) and of performing the DFT (step 450) do not necessarily occur at the same time or place when the determinations of the left-side steps in FIG. 4 (steps 401–480) are made. It is equally possible to determine well before a particular DFT is performed, what patterns of PLU's will be sensitized and desensitized, the order of such patterns and their timings. Then, when the particular dynamic function test is desired, these pre-generated patterns are scan-loaded into the line-driving OSL's (e.g. 360, 370 and 380 of FIG. 3B) in the predetermined order and at the predetermined time points to carry out the DFT. The scan-loading of these predefined patterns can be performed by an on-line SVP 250 or, if IC chips and/or circuit boards are being tested off-line, by another automated test-fixture which is coupled to the scan bus (or scan pins) of the IC chip or chips under test.

While the above examples show how the scan testing subsystem of the invention may be used within a complete computer system, it is to be understood that the utility of the invention is not limited to such an environment alone. The invention is useful in scanning complete systems which are up and running, but it is also advantageously used to scan parts of the system as they are first being designed, developed, and cooperatively coupled one to the next.

The need for high-speed scan testing begins with the first steps in the design, development and manufacture of a high-performance computer. A hierarchical sequence of steps is followed, making the time consumed by first-level testing procedures just as critical as those in the completed computer.

The design of a computer (or other complex electronic system) usually starts at a relatively high level of abstraction where there are no logic gates or IC chips or boards or other implementation features. But the design has to be ultimately reduced to specific collections of logic gates or transistors on one or more IC chips; to specific IC chips on one or more circuit boards; to specific boards on one or more frames, and so on. Once such implementation details are defined, methods should be simultaneously devised for verifying the design, operability and reliability of the system components on a mass production basis as they progress from chip level to board level, to frame level and so on.

Since a very large number of transistors (e.g., a hundred thousand per chip) or logic gates (e.g., 10,000 to 15,000 per chip) is usually defined in each of a large plurality of integrated circuit (IC) chips when complex circuits are assembled, methods should be devised for quickly verifying the proper static and dynamic functioning of all subcircuits of each IC chip at the transistor and/or logic gate level. By defining a control mesh 350 for selectively sensitizing or desensitizing a matrix of PLU's as shown in FIG. 3B it becomes relatively simple to isolate one subcircuit from the next and to perform both static and dynamic function tests. This helps to speed the development and production process.

At each step of the hierarchical manufacturing process (wafer level, chip level, board level, etc.) it is desirable to test and weed out defective components and/or to eliminate bugs in circuit or software designs as quickly as possible so that the reliability of the end product is enhanced. Wafers are probed to weed out bad IC chips or bugs in the design of each chip. Packaged chips are mounted on test fixtures and further tested to weed out those damaged by packaging. Completed circuit boards are tested after the chip mounting step. And so on.

Scan test circuitry in accordance with the invention is preferably built into every subcomponent of the computer system to enable rapid testing throughout the life of a computer system from the point of initial development through bring-up and beyond. The maintenance and service processor (SVP) 250 of FIG. 2, for example, is programmed to advantageously use the dynamic function test matrix (350) in each IC chip of the mainframe 200 to record a history of dynamic performances and to use the recorded history for predicting failures before they happen.

While a number of embodiments and uses in accordance with the invention have been illustrated, it is to be understood that numerous variations and modifications will become apparent to those skilled in the art after studying the above disclosure. By way of example, OR gates or other digital circuits may be used in place of the clock-passing AND gates 310 to implement the function of selectively sensitizing or desensitizing a corresponding scan latch. Logic technologies other than ECL may be used. The control mesh 350 may be distributed over the substrate of hybrid circuit or a printed circuit board as well as over that of an IC chip. Dynamic function tests may be conducted on individual IC chips or printed circuit boards or modules of a mainframe computer either while they are installed in the mainframe or while they are not so installed. Subcircuits in systems other than computer systems (e.g. telecommunication systems) can be tested in on-line or off-line modes. The following claims are accordingly not limited to the specific descriptions found above, but rather encompass all embodiments and methods within the spirit of the above disclosure.

What is claimed is:

1. A scan-testable machine comprising:
   a plurality of clock-sensitive scan latches, each coupled to receive system clock signals from a clock supply means;
   a first plurality of control lines;
   a second plurality of control lines crossing with the first plurality of control lines to form a control mesh having a plurality of control points which are addressable by said control lines; and
   a plurality of response-control means, each associated with one of said control points and one of said clock-sensitive scan latches, each response-control means being responsive to enabling or disabling control signals provided on the control lines of its associated control point for selectively enabling or disabling its associated scan latch to correspondingly respond or not respond to the system clock signals.

2. A scan-testable machine as in claim 1 further comprising:
   a circuit supporting substrate supporting the control lines of said control mesh, said plurality of response-control means and said plurality of clock-sensitive scan latches, the scan latches being distributed across the substrate; and
   a functional circuit having a plurality of subcircuits distributed across said substrate and operatively coupled to one another for performing one or more prespecified functions;
   wherein said clock-sensitive scan latches are interposed between said subcircuits for isolating the subcircuits from one another during a test mode and for coupling the subcircuits to one another during a nontest mode.

3. A scan-testable machine as in claim 2 wherein:
   said first plurality of control lines consists of X-directed lines extending across the substrate in an X direction;
   said second plurality of control lines consists of Y-directed lines extending across the substrate in an Y direction different from said X-direction;
   said scan-testable machine further comprises a third plurality of Z-directed lines extending across the substrate in a Z-direction different from said X and Y directions, each of said Z-directed lines crossing with at least one X-directed line and/or at least one y-directed line to define, by such intersection, a corresponding control point, and
   at least one of said response-control means is further responsive to enabling or disabling control signals provided on the Z-directed control line of its associated control point for selectively enabling or disabling its associated scan latch to correspondingly respond or not respond to the system clock signals.

4. A scan-testable machine as in claim 2 wherein said circuit supporting substrate is the substrate of an integrated circuit (IC).

5. A scan-testable machine as in claim 4 wherein each of said control lines is one or less microns wide.

6. A scan-testable machine as in claim 2 further comprising:
   a plurality of line-driving means each coupled to a corresponding one of said control lines, the plurality of line driving means being disposed on said circuit supporting substrate and occupying less than thirty percent of the surface area of said circuit supporting substrate.

7. A scan-testable machine as in claim 6 wherein the difference between the number of control lines in said first plurality and said second plurality is two or less.

8. A scan-testable machine as in claim 6 wherein the number of control lines in said first plurality is in the range 16 to 32 and the number of control lines in said second plurality is in the range 16 to 32 thereby defining a number of control points in the range 256 to 1024.

9. A scan-testable machine as in claim 6 further comprising a scan control unit provided on said circuit supporting substrate,
   wherein each of said line-driving means is an operating state latch whose state is controlled by said scan control unit.

10. A scan-testable machine as in claim 1 wherein:
    said first plurality of control lines comprises X-directed lines extending across the substrate in an X direction; and
    said second plurality of control lines comprises Y-directed lines extending across the substrate in an Y direction, substantially at right angles to said X-direction.

11. A scan-testable machine as in claim 10 further comprising:
    a first set of line-driving means each for driving a corresponding one of said X-directed lines;
    a second set of line-driving means each for driving a corresponding one of said Y-directed lines;
    wherein the number of control points to be defined by the intersection of said X-directed and Y-directed lines is predefined and
    wherein the total number of said X-directed and Y-directed lines driven by said first and second sets of line-driving means is essentially minimized relative to said predefined number of control points so that the total number of line-driving means in said first and second sets is essentially minimized.

12. A scan-testable machine as in claim 1 further comprising:
    scan control means, coupled to said first and second pluralities of control lines, for selectively applying enabling control signals to a preselected two or one control lines in said first plurality of control lines and selectively applying control signals to a preselected two or one control lines in said second plurality of control lines to thereby address a corresponding two or four control points of said mesh and enable the scan latches of the associated two or four response-control means to respond to system clock signals,
    said scan control means further applying disabling control signals to a preselected one or more other control lines in said first and second pluralities of control lines thereby address a corresponding one or more other control points of said mesh and disable the scan latches of the associated one or more response-control means from responding to system clock signals.

13. A scan-testable machine as in claim 12 further comprising:
    a third plurality of control lines crossing with the first and second pluralities of control lines, the intersections of the first, second and third pluralities of control lines defining some or all of the control points in said control mesh;

wherein at least one of said response-control means is further responsive to enabling or disabling control signals provided on an associated control line of the third plurality of control lines for selectively enabling or disabling its associated scan latch to correspondingly respond or not respond to the system clock signals, and wherein said scan control means is further coupled to said third plurality of control lines for applying enabling and/or disabling control signals to said third plurality of control lines for respectively enabling and/or disabling preselected ones of said scan latches to respond or not respond to the system clock signals.

14. A scan-testable computer having a plurality of integrated circuit (IC) devices wherein each IC device comprises:
   a substrate;
   a functional circuit integrally formed on the substrate, the functional circuit being composed of a plurality of subcircuits;
   a plurality of clock-sensitive scan latches, each coupled to receive system clock signals from a clock supply means and data signals from a corresponding one of said subcircuits, where each clock-sensitive scan latch stores received data signals in response to the system clock pulses when the scan-latch is enabled to respond to the system clock signals;
   a first plurality of control lines provided on said substrate;
   a second plurality of control lines provided on said substrate and crossing with the first plurality of control lines to form a control mesh having a plurality of control points defined by the intersections of said control lines; and
   a plurality of response-control means, each associated with one of said control points and one of said clock-sensitive scan latches, each response-control means being responsive to enabling or disabling control signals provided on the control lines of its associated control point for selectively enabling or disabling its associated scan latch to correspondingly respond or not respond to the system clock signals 15. A method for selectively desensitizing one or more scan latches in a plurality of clock-sensitive scan latches of a scan-testable system from responding to system clock pulses, the method comprising the steps of:
   forming a mesh composed of a first set of control lines intersecting with a second set of control lines;
   providing a plurality of response-control elements, each coupled to a control line of said first set, a control line of said second set and to one of the clock-sensitive scan latches for selectively enabling or disabling the one scan latch to respectively respond or not respond to system clock pulses in accordance with control signals supplied on the control lines which said response control element is coupled to; and
   supplying response-disabling control signals to one or more control lines in either or both of said first and second sets to thereby disable one or more scan latches whose response-control elements are coupled to the control lines receiving said response-disabling control signals.

16. The method of claim 15 wherein said supplying step further includes:
   supplying scan control signals on a scan bus coupled to said scan-testable system;
   driving each of the control lines in said mesh with a corresponding line-driving latch which is responsive to said scan control signals, and
   setting or resetting each line-driving latch in accordance with said scan control signals.

17. A method for testing the dynamic behavior of a subcircuit in a circuit having a plurality of subcircuits and a plurality of clock-sensitive scan latches, where each clock-sensitive scan latch is coupled to receive system clock pulses, the method comprising the steps of:
   (a) coupling an output terminal of a first clock-sensitive scan latch to an input node of said subcircuit;
   (b) coupling an input terminal of a second clock-sensitive scan latch to an output node of said subcircuit;
   (c) providing response-selection means for selectively enabling or disabling each of said scan latches to respectively respond or not respond to system clock pulses, where a responding scan latch forwards a data signal presented at its input terminal to its output terminal and where a nonresponding scan latch forwards a data signal prestored within the scan latch to its output terminal;
   (d) at a first time point, $t_0$, supplying to the input terminal of the first scan latch a first logic signal of a state opposite to that of a data signal prestored in said first scan latch;
   (e) enabling both the first and second scan latches;
   (f) at a second time point, $t_1$, supplying a first clock pulse to the enabled first and second scan latches;
   (g) at a third time point, $t_2$, following the second time point, $t_1$, supplying a second clock pulse to the enabled first and second scan latches;
   (h) scanning a data signal stored in the second scan latch out from said circuit after the third time point, $t_2$, for external analysis.

18. The testing method of claim 17 further comprising the steps of:
   (i) directly or indirectly coupling an output terminal of a third scan latch to drive an input terminal of said first scan latch, the third scan latch being either a clock-sensitive scan latch or a clock-insensitive scan latch;
   (j) before the first time point, $t_0$, disabling both the first and second scan latches;
   (k) before the first time point, $t_0$, determining whether the third scan latch is a clock-sensitive scan latch, and if so, disabling the third scan latch; and
   (l) at the first time point, $t_0$, scanning-in said first logic signal into said third scan latch to thereby supply it to the input terminal of the first scan latch.

19. The testing method of claim 18 further comprising the steps of:
   (m) before the second time point, $t_1$, scanning-in a second logic signal into said second scan latch, the second logic signal being opposite in state to the state of a third logic signal then present at the output node of said subcircuit.

20. The testing method of claim 18 further comprising the steps of:
   after step (h), disabling the first and second scan latches and repeating steps (a) through (h) but varying the interval between the second time point, $t_1$, and the third time point, $t_2$.

21. The testing method of claim 17 wherein the step (c) of providing response-selection means further includes the steps of:
- forming a mesh, across said subcircuit, composed of a first set of control lines intersecting with a second set of control lines;
- providing a plurality of response-control elements, each coupled to a control line of said first set, a control line of said second set and to one of the clock-sensitive scan latches for selectively enabling or disabling the one scan latch to respectively respond or not respond to system clock pulses in accordance with control signals supplied on the control lines which said response control element is coupled to; and
- supplying response-disabling control signals to one or more control lines in either or both of said first and second sets to thereby disable one or more scan latches whose response-control elements are coupled to the control lines receiving said response-disabling control signals.

* * * * *

UNITED STATES PATENT AND TRADEMARK OFFICE
CERTIFICATE OF CORRECTION

PATENT NO. : 5,235,600  
DATED : August 10, 1993  
INVENTOR(S) : Robert Edwards Page 1 of 2

It is certified that error appears in the above-identified patent and that said Letters Patent is hereby corrected as shown below:

Column 1, line 56, delete "$SP_{ZYK}$" and insert --$SP_{zyk}$--;
Column 1, line 58, delete "$SP_{ZYK}$" and insert --$SP_{zyk}$--;
Column 1, line 60, delete "$(SP_{ZYK})$" and insert --$(SP_{zyk})$--;
Column 4, line 24, delete "Where" and insert --where--;
Column 7, line 62, after "above" insert --summary--;
Column 7, line 64, after "enabled" insert a comma --,--;
Column 8, line 8, delete the comma after "FIG. 2";
Column 8, line 43, after ". . ." insert a comma --,--;
Column 8, line 54, after "operations" delete one period;
Column 8, line 62, insert a space between "$CKT_{ZYX}$" and "is";
Column 9, line 63, delete "13" and insert --131--;
Column 10, line 30, delete "a" and insert --as--;
Column 10, line 46, delete "$CKI_{def}$" and insert --$CKT_{def}$--;
Column 12, line 13, delete "$t_1$and" and insert --$t_1$ and--;
Column 12, line 19, delete "$NI_{131a}$of" and insert --$NI_{131a}$ of--;
Column 13, line 24, after ". . ." insert a comma --,--;
Column 13, line 55, after "X-direction" insert a period --.--;
Column 14, line 6, delete the numeral "(0)" and insert the letter --(O)--;
Column 14, line 67, delete "$N_y$represents" insert --$N_y$, represents--;
Column 17, line 68, after "$NI_{334a}$" insert a period --.--;
Column 18, line 28, after "$NI_{333a}$" insert a period --.--;

UNITED STATES PATENT AND TRADEMARK OFFICE
CERTIFICATE OF CORRECTION

PATENT NO.  : 5,235,600

DATED       : August 10, 1993

INVENTOR(S) : Robert Edwards

It is certified that error appears in the above-identified patent and that said Letters Patent is hereby corrected as shown below:

Column 19, line 8, before "then" insert --can--; and
Column 27, line 49, replace "y-directed" with --Y-directed--.

Signed and Sealed this

Twenty-fifth Day of April, 1995

Attest:

BRUCE LEHMAN

Attesting Officer    Commissioner of Patents and Trademarks